United States Patent [19]

Yokomizo et al.

[11] Patent Number: 5,671,544
[45] Date of Patent: Sep. 30, 1997

[54] SUBSTRATE DRYING APPARATUS AND SUBSTRATE DRYING METHOD

[75] Inventors: Kenji Yokomizo, Onojo; Hiroshi Tanaka, Kurume; Shori Mokuo, Saga-ken; Teruomi Minami, Kurume, all of Japan

[73] Assignees: Tokyo Electron Limited, Tokyo; Tokyo Electron Kyushu Limited, Tosu, both of Japan

[21] Appl. No.: 697,132

[22] Filed: Aug. 20, 1996

Related U.S. Application Data

[62] Division of Ser. No. 330,793, Oct. 28, 1994, Pat. No. 5,575,079.

[30] Foreign Application Priority Data

| | | | |
|---|---|---|---|
| Oct. 29, 1993 | [JP] | Japan | 5-294333 |
| Jan. 17, 1994 | [JP] | Japan | 6-016979 |
| Feb. 15, 1994 | [JP] | Japan | 6-040396 |
| Aug. 23, 1994 | [JP] | Japan | 6-221161 |

[51] Int. Cl.$^6$ .................................................. F26B 21/06
[52] U.S. Cl. ........................................... 34/78; 34/169
[58] Field of Search ................................ 34/565, 566, 561, 34/60, 61, 62, 64, 65, 78, 73, 82, 169, 212; 210/774; 134/105, 108, 902

[56] References Cited

U.S. PATENT DOCUMENTS

| | | | |
|---|---|---|---|
| 5,054,210 | 10/1991 | Schumacher et al. | 34/73 X |
| 5,142,873 | 9/1992 | Ramsey, Jr. | 34/78 X |
| 5,246,023 | 9/1993 | Breunsbach et al. | 134/902 X |
| 5,369,891 | 12/1994 | Kamikawa | 34/78 |
| 5,443,540 | 8/1995 | Kamikawa | 34/471 |
| 5,520,744 | 5/1996 | Fujikawa et al. | 134/902 X |

*Primary Examiner*—John M. Sollecito
*Assistant Examiner*—Steve Gravini
*Attorney, Agent, or Firm*—Oblon, Spivak, McClelland, Maier & Neustadt, P.C.

[57] ABSTRACT

A substrate drying apparatus includes a process bath having an object containing region for containing an object to be treated, a treatment liquid containing region for containing a volatile treatment liquid, and heating member for evaporating the treatment liquid, a receiving container, provided below the object containing region, for receiving water removed from the object with use of the evaporated treatment liquid, an exhaust pipe, attached to the container, for exhausting the water from the container to the outside of the process bath, and a cooling device, provided above the object containing region of the process bath, for condensing the evaporated treatment liquid, wherein the exhaust pipe has a valve and a branch pipe branched from the exhaust pipe such that the branch pipe is closer to the container than the valve is.

15 Claims, 19 Drawing Sheets

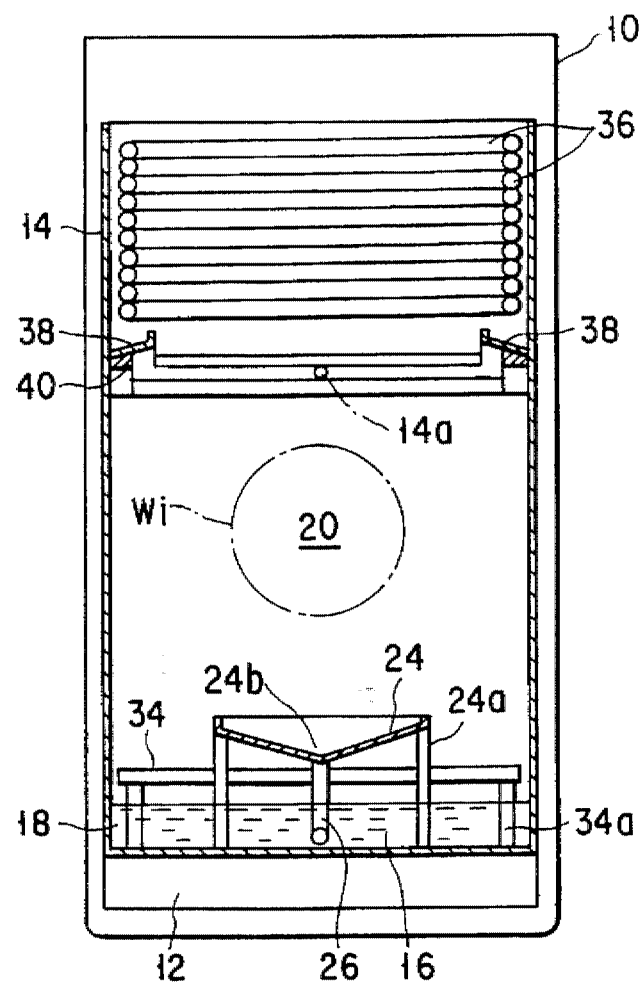
F I G. 2
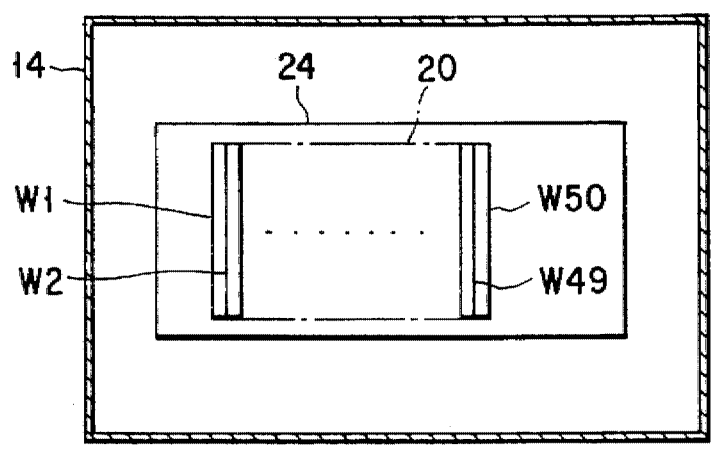
F I G. 3

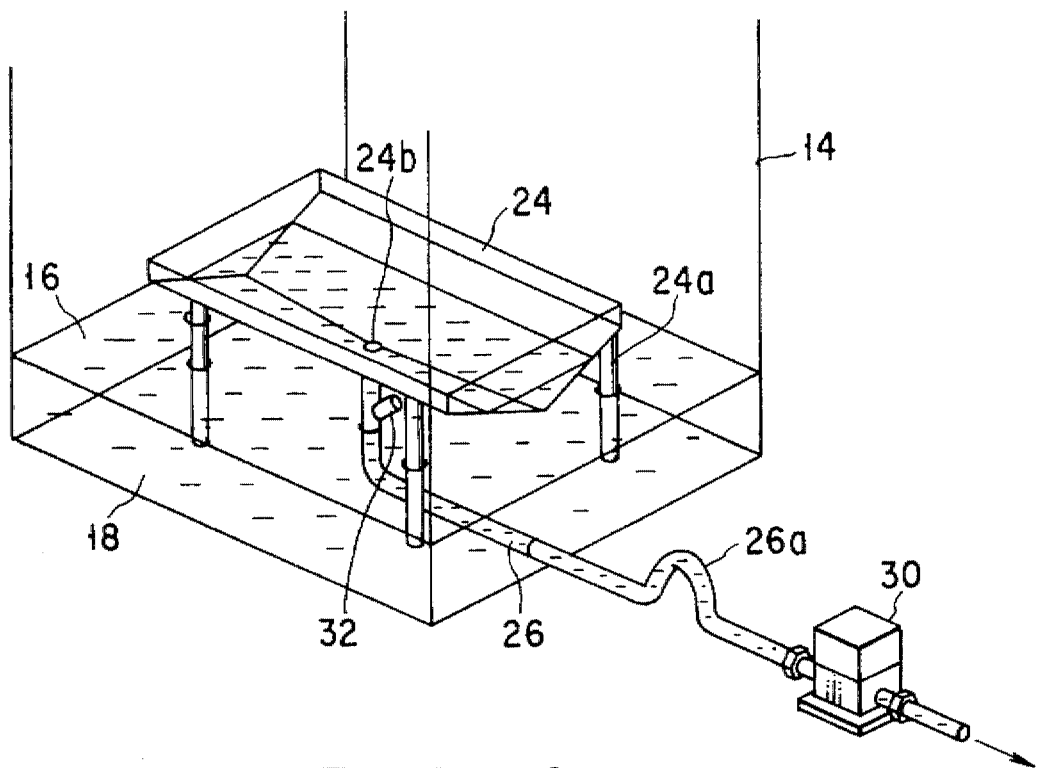
F I G. 4
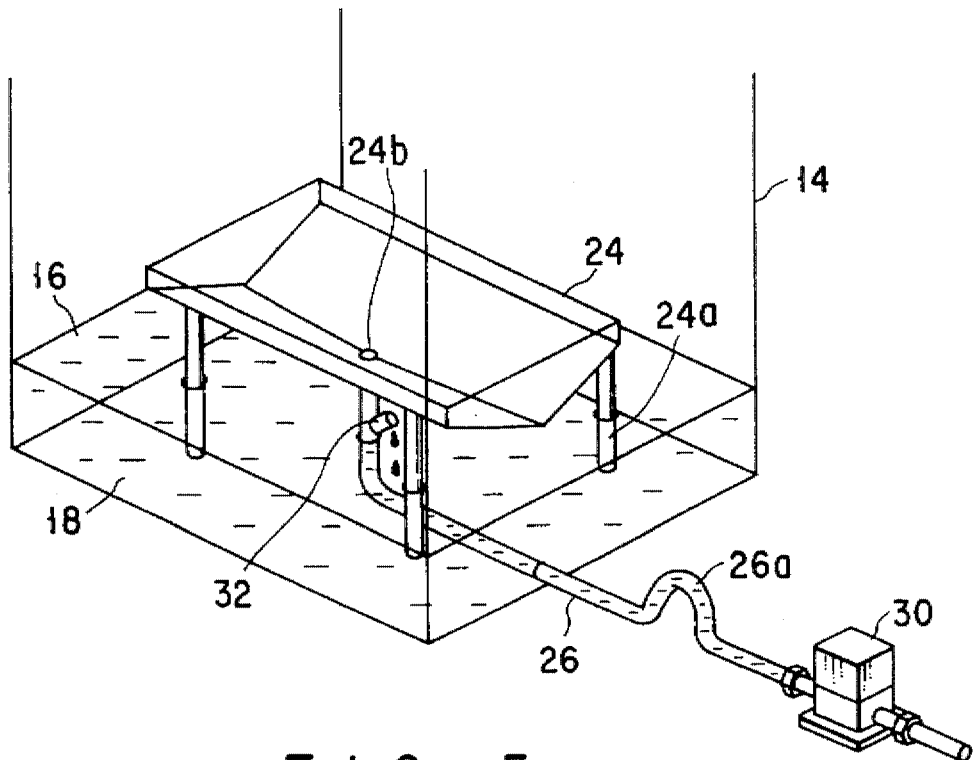
F I G. 5

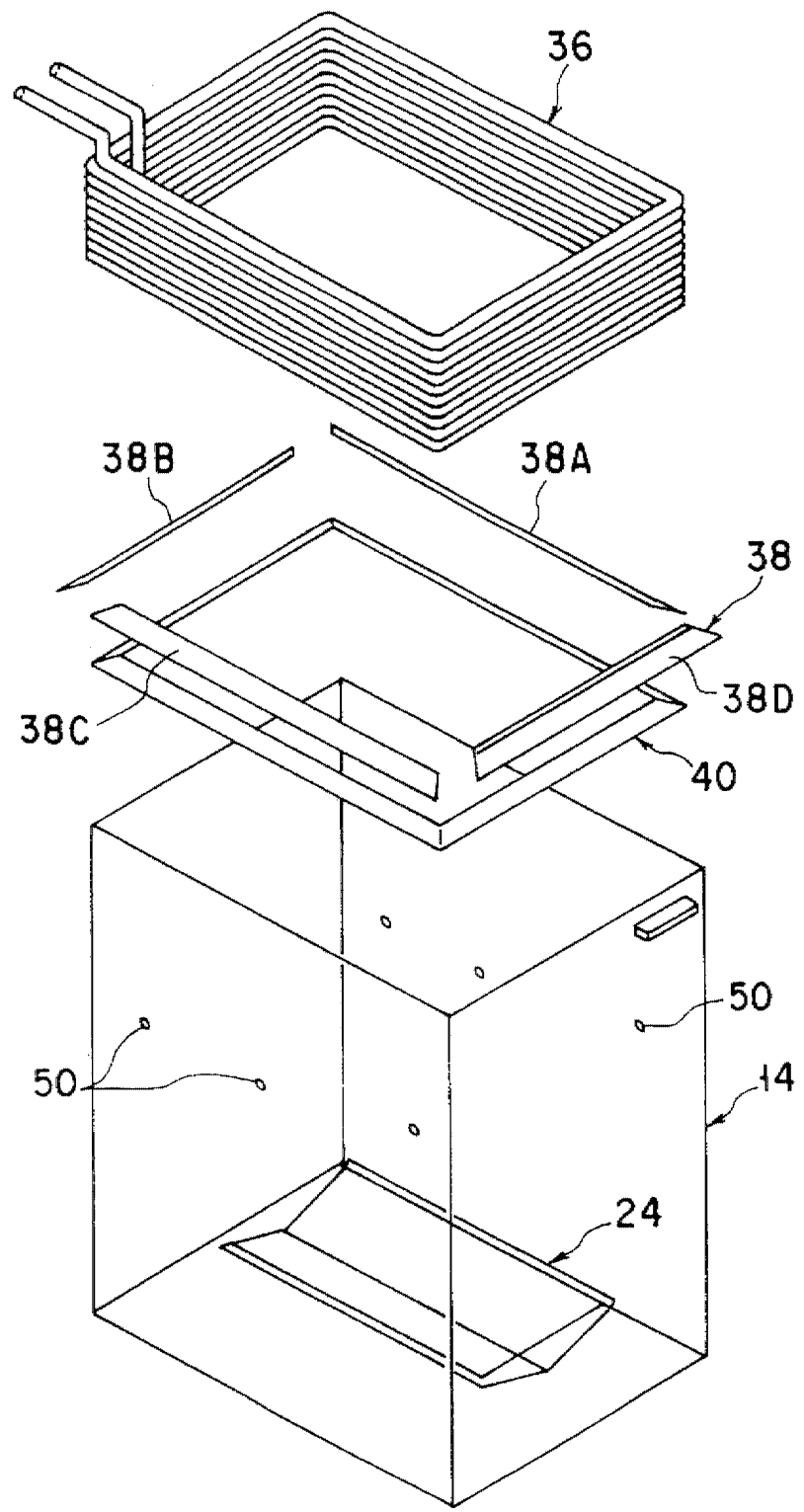
F I G. 8

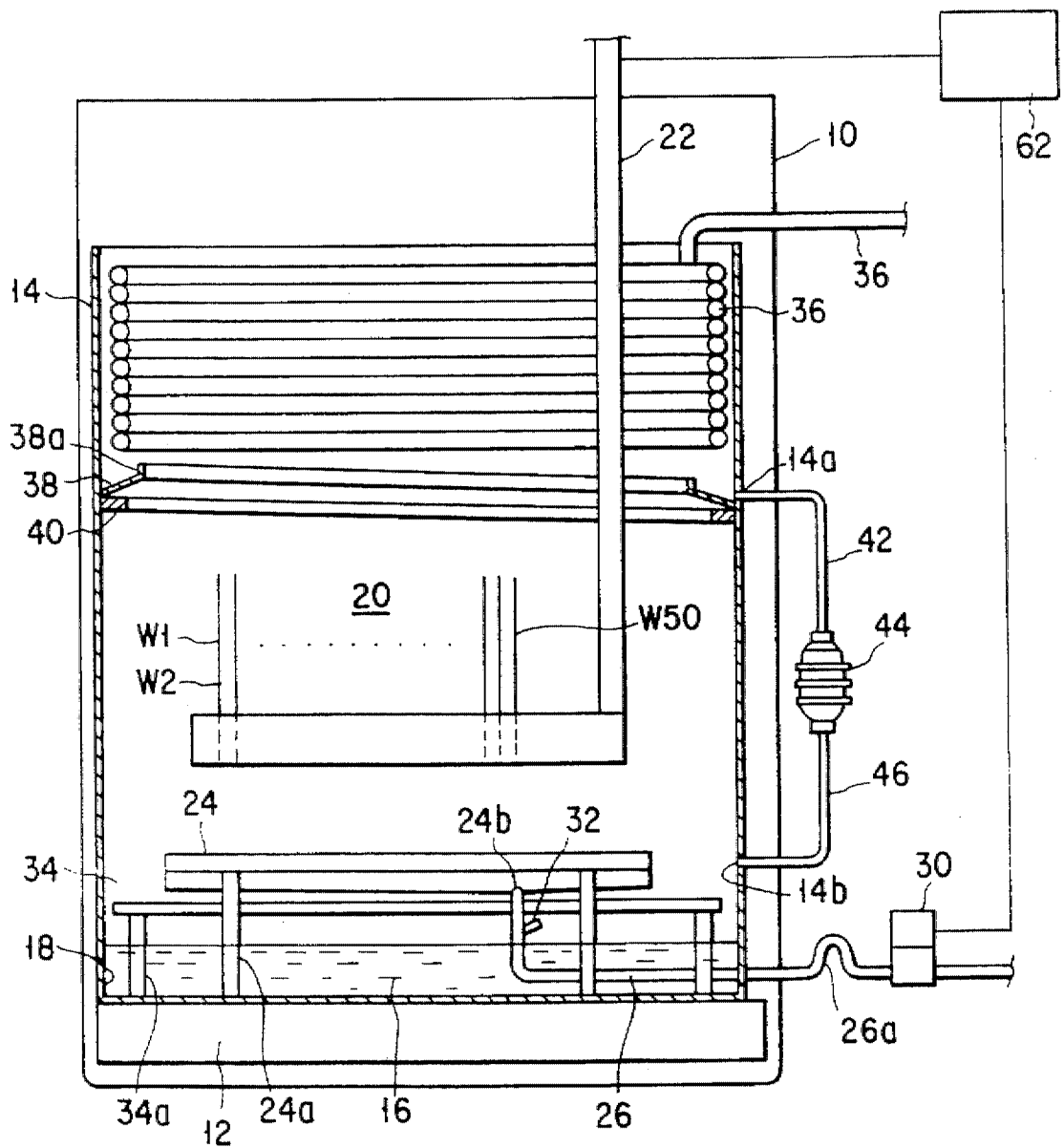
F I G. 11

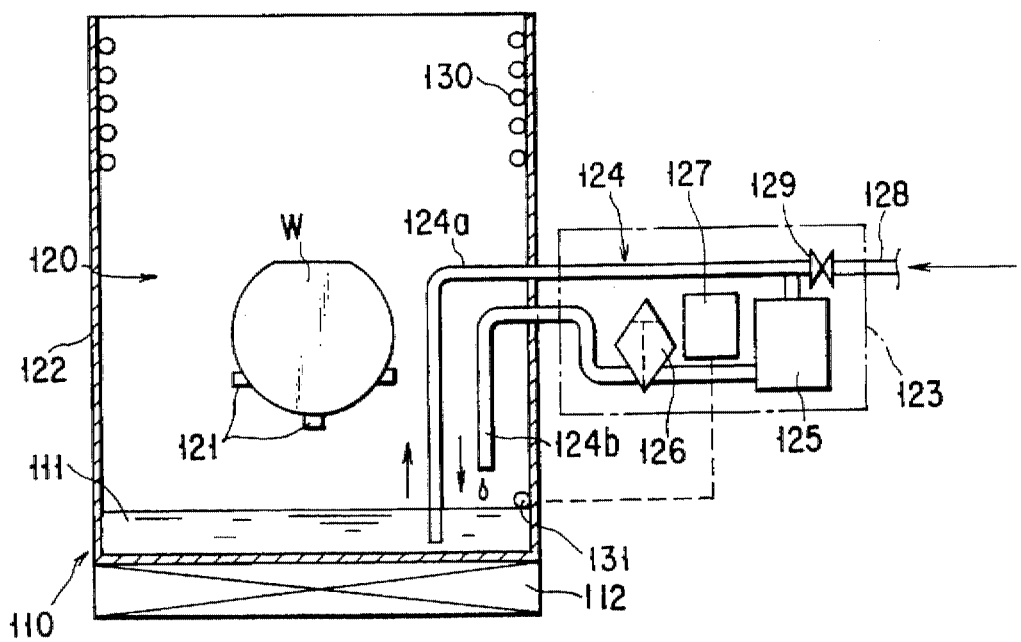
F I G. 14
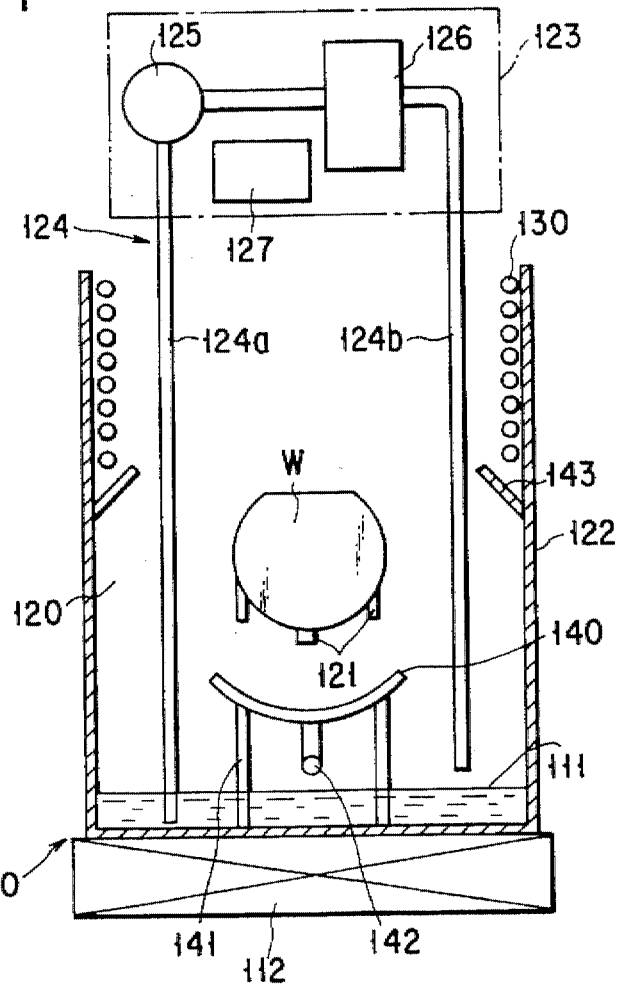
F I G. 15

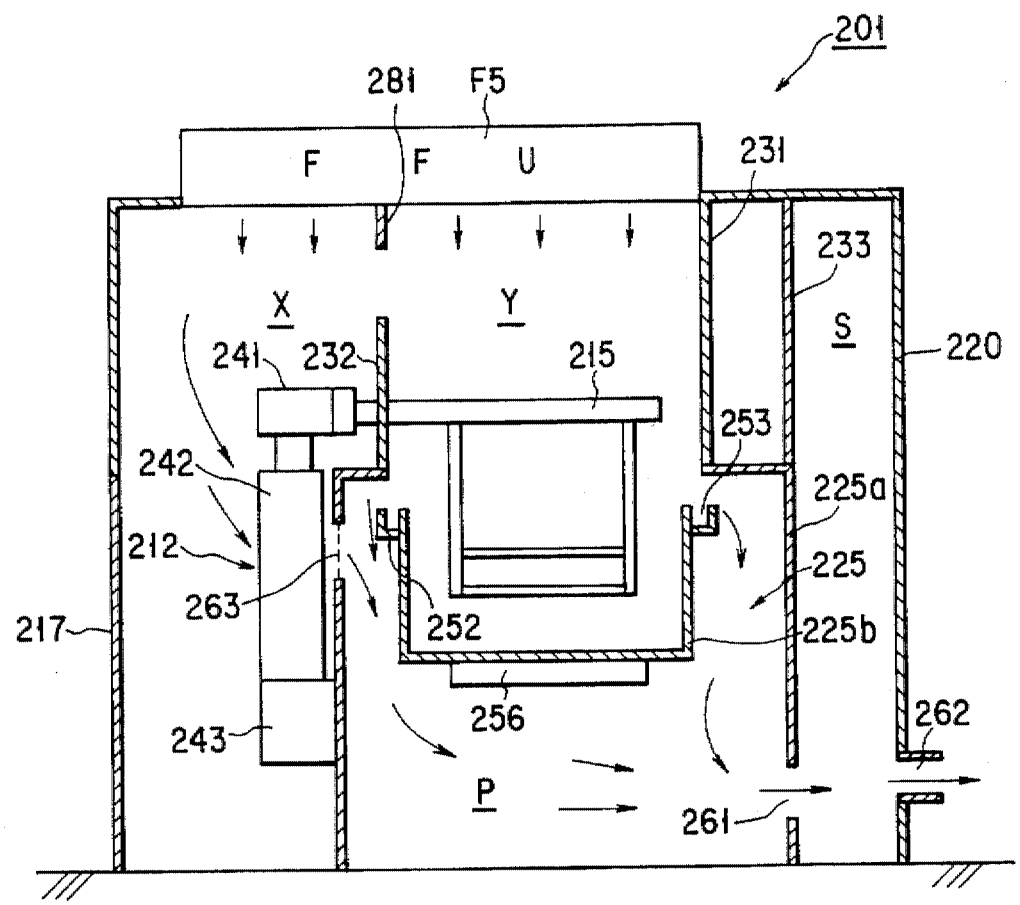
F I G. 17
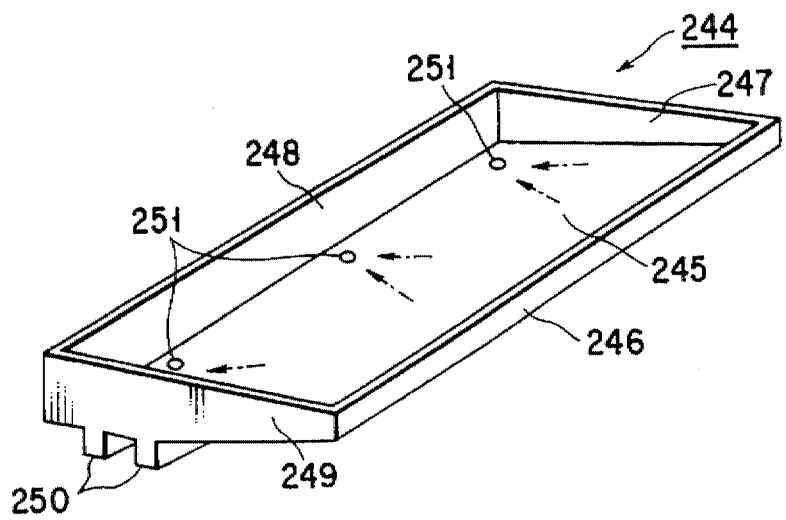
F I G. 18

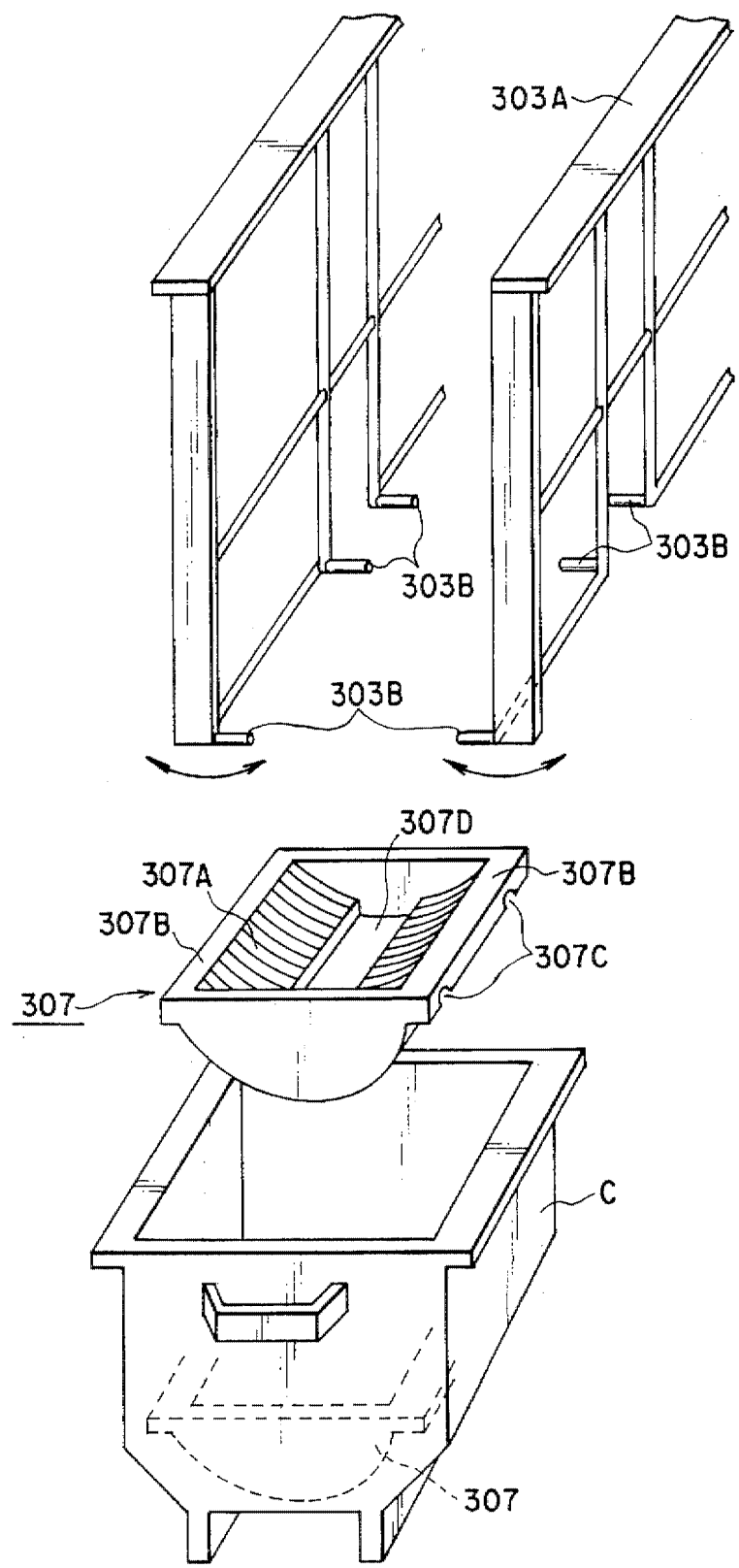
F I G. 28

SUBSTRATE DRYING APPARATUS AND SUBSTRATE DRYING METHOD

This is a division of application Ser. No. 08/330,793, filed on Oct. 28, 1994, U.S. Pat. No. 5,575,079.

BACKGROUND OF THE INVENTION

1. Field of the Invention

The present invention relates to an apparatus and a method for drying an object to be treated, such as a semiconductor wafer (hereinafter referred to "wafer"), after the object is washed.

2. Description of the Related Art

In an apparatus for drying a washed object to be treated such as a wafer, a predetermined treatment liquid, e.g. isopropyl alcohol (IPA), having volatility is heated and evaporated in a bottom portion of a treatment bath. Using the vapor of IPA, water adhering to the surface of the object is removed. The water is received in a receiver situated in the treatment bath. The water is exhausted from the receiver to a drain tank outside the treatment bath via an exhaust pipe. A cooling spiral pipe is provided at an upper part of the treatment bath along a side wall of the treatment bath, in order to prevent the IPA vapor from escaping to the outside of the treatment bath. The IPA vapor is condensed (liquefied) by the cooling spiral pipe, and the IPA liquid drops are restored to a treatment liquid reservoir provided at a bottom portion of the treatment bath.

Treatment liquid drops produced by condensation of vapor of the treatment liquid are also put in the receiver. The temperature of the atmosphere within the treatment bath is kept at a substantially constant temperature, e.g. about 80° C. However, the outside heat is transmitted to the receiver via the exhaust pipe, and the treatment liquid vapor near the receiver is cooled and condensed. The condensation of the treatment liquid near the receiver occurs not only during the drying of the object but also during the standby state of the drying process (water elimination). The conventional substrate drying apparatus of the type in which a liquid is exhausted from the receiver via the exhaust pipe. Thus, the treatment liquid in the receiver is exhausted equally during the drying of the object and the standby state.

However, the treatment liquid put in the receiver during the drying of the object is not mixed with water and not contaminated. If this treatment liquid is exhausted, it is wasted. In fact, this type of substrate drying apparatus is often operated 24 hours per day. Of the 24 hours, the actual operation time (in which the drying process is carried out) is about 8 hours, and the other hours are used in the standby state. Even if the amount of treatment liquid exhausted uselessly from the receiver during the standby time is small, a considerable amount of such treatment liquid, e.g. about 20 .h, is exhausted in a day.

In addition, in the conventional substrate drying apparatus, a gutter for receiving treatment liquid drops naturally falling from the cooling spiral pipe is provided just below the cooling spiral pipe along the side wall of the treatment bath. The treatment liquid received in the gutter is let to flow through a gap between the gutter and the inner wall of the treatment bath to the treatment liquid reservoir in the bottom portion of the treatment bath. However, in this kind of treatment liquid recovery method, the treatment liquid to be recovered, along with contamination, dust, etc. adhering to the gutter and the inner wall of the treatment bath, flows to the treatment liquid reservoir. Thus, the purity of the treatment liquid tends to deteriorate. Accordingly, the treatment liquid must be changed frequently. Furthermore, there is a concern that the treatment liquid falling through the gap between the gutter and the inner wall of the treatment bath is dispersed and adhered to the object, receiver, etc.

SUMMARY OF THE INVENTION

An object of the present invention is to provide a substrate drying apparatus and a substrate drying process, wherein a treatment liquid which falls, when the vapor of a treatment liquid is condensed, in a receiver for receiving water removed from objects with use of vapor of the treatment liquid can be efficiently recovered in a treatment liquid reservoir in a process bath, without any waste, during the drying process standby time, thereby reducing the amount of consumed treatment liquid.

Another object of the invention is to provide a substrate drying apparatus wherein dust, etc. mixed in a treatment liquid can be removed, thereby preventing degradation of the treatment liquid and reducing the amount of consumed treatment liquid.

According to the present invention, there is provided a substrate drying apparatus comprising: a process bath having an object containing region for containing an object to be treated, a treatment liquid containing region for containing a volatile treatment liquid, and heating means for evaporating the treatment liquid; a receiving container, provided below the object containing region, for receiving water removed from the object with use of the evaporated treatment liquid; an exhaust pipe, attached to the container, for exhausting the water from the container to the outside of the process bath; cooling means, provided above the object containing region of the process bath, for condensing the evaporated treatment liquid; and treatment liquid circulating means, provided in the process bath, for circulating the treatment liquid, wherein the exhaust pipe has a valve and a branch pipe branched from the exhaust pipe such that the branch pipe is closer to the container than the valve is, and the treatment liquid circulating means includes treatment liquid purifying means.

According to the substrate drying apparatus with the above structure, the valve is closed during the drying process. Thus, the water removed from the surface of the object is temporarily received in the container and then exhausted via the exhaust pipe. On the other hand, the valve is closed during the drying process standby time. Thus, the condensed treatment liquid in the container is not exhausted to the outside and recovered to the process bath via the branch pipe. Impurities, dust, etc. are eliminated by the treatment liquid purifying means from the treatment liquid circulated by the treatment liquid circulating means and thus the treatment liquid is purified. Thereby, the degradation of the treatment liquid is prevented. As a result, the amount of consumed treatment liquid can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1 and 2 show schematically an embodiment of a substrate drying apparatus according to Example 1 of the present invention;

FIG. 3 shows a region of a receiver in relation to a water removing region in the substrate drying apparatus shown in FIG. 1;

FIG. 4 illustrates the operation of the substrate drying apparatus according to Example 1 during a drying process;

FIG. 5 illustrates the operation of the substrate drying apparatus according to Example 1 in a standby state;

FIG. 8 shows an example wherein the division-type plate gutter structure shown in FIG. 7 is applied to cooling means;

FIGS. 10 and 11 schematically show another embodiment of the substrate drying apparatus of Example 1;

FIGS. 13 to 15 schematically show a substrate drying apparatus according to Example 2 of the present invention;

FIGS. 16, 17 and 22 illustrate a washing system in which a substrate drying apparatus of the present invention is used;

FIG. 18 is a perspectively view showing mainly a chemical liquid treatment bath in the washing system as shown in FIG. 16;

FIG. 28 is a perspective view showing another transfer jig in the washing system according to Example 4.

DETAILED DESCRIPTION OF THE PREFERRED EMBODIMENTS

Embodiments of the present invention will now be described in detail with reference to the accompanying drawings.

Example 1

Figure 1:
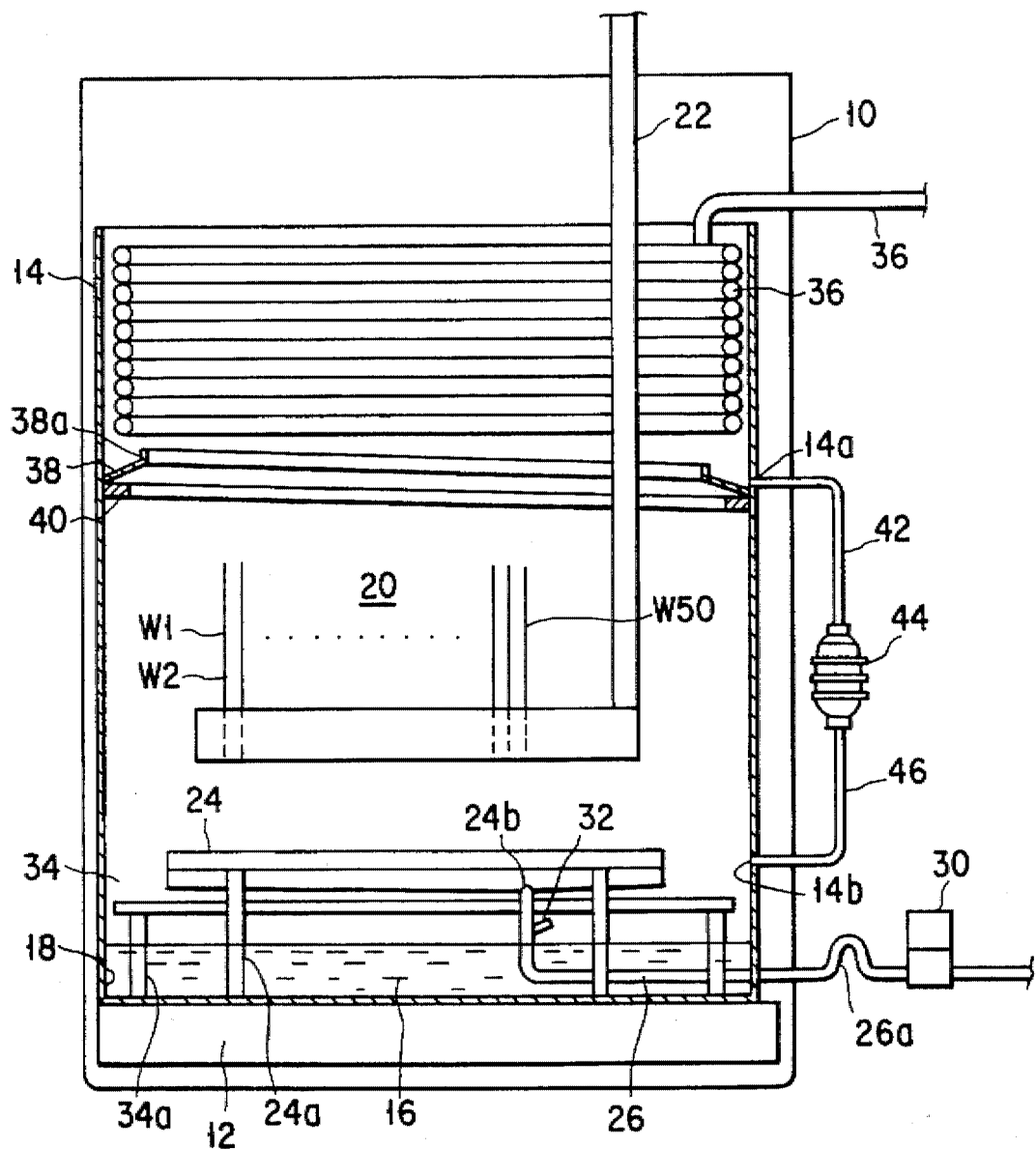

FIGS. 1 and 2 are a front view and a side view showing the structure of an embodiment of a substrate drying apparatus according to the present invention. A transfer arm 22 shown in FIG. 1 is omitted in FIG. 2. The substrate drying apparatus comprises a bottomed rectangular container 10 made of, e.g. stainless steel. A heating unit 12 is situated at the bottom of the drying apparatus. A bottomed rectangular treatment bath 14 made of, e.g. quartz is situated within the container 10 above the heating unit 12, with a gap between the side wall of the container 10 and the treatment bath 14. A predetermined volatile treatment liquid 16, e.g. IPA, is put in a bottom portion of the treatment bath 14 up to a predetermined liquid level. Where necessary, the treatment liquid 16 is changed or replenished via a treatment liquid introducing port and an exhaust port (not shown) formed at the wall or bottom of the treatment bath 14. In this way, the bottom portion of the treatment bath 14 constitutes a treatment liquid reservoir 18 or a treatment liquid container region.

While power is being supplied to the substrate drying apparatus, the treatment liquid 16 in the treatment liquid reservoir 18 is evaporated by heat from the heating unit 12 during the drying process or in the drying process standby state. As a result, a vaporous atmosphere of the treatment liquid 16 forms in a region above the treatment liquid reservoir 18. A vapor treatment section 20 or an object containing region is situated at a substantially middle level within the treatment bath 14. At the time of the treatment, a plurality of wafers, e.g. 50 wafers W1 to W50, are situated in the vapor treatment section 20 while they are held or supported by a transfer arm 20. In this case, the wafers W may be situated in the vapor treatment section 20 by the transfer arm 22 after the wafers W were transferred from another transfer means to the transfer arm 22, or may be situated in the vapor treatment section 20 directly by the transfer arm 22.

A receiver 24 made of, e.g. quartz is situated in the bottom portion of the treatment bath 14 just below the vapor treatment section 20 and above the liquid level of the treatment liquid 16. The receiver 24 is attached to the bottom of the treatment bath 14 by legs 24a formed integral to the lower surface of the receiver 24. As is shown in FIG. 3, an upper surface (a water receiving surface) of the receiver 24 is broader than the vapor treatment section 20 for the wafers W so that the receiver 24 may receive water containing treatment liquid, which separates or falls from the wafers W1 to W50 during the drying process.

A liquid exhaust port 24b is formed at a bottom portion of the receiver 24. A liquid exhaust pipe 26 is connected to the liquid exhaust port 24b. The exhaust pipe 26 extends through the treatment liquid reservoir 18, penetrates the treatment bath 14 and container 10 and reaches an external exhaust liquid recovery unit, e.g. a drain tank (not shown). It is desirable that at least a portion of the exhaust pipe 26, which is situated within the treatment bath 14, be formed of quartz or Teflon. The holes in the walls of the treatment bath 14 and container 10, which the exhaust pipe 26 is passed, may be sealed by suitable sealing members (not shown).

In the present embodiment, the exhaust pipe 26 is provided with a U-shaped trap portion 26a on the outside of the container 10. A valve 30, e.g. an air operational valve, is provided on the downstream side of the trap portion 26a, i.e. on the drain tank side. On the other hand, the exhaust pipe 26 within the treatment bath 14 is integrally provided with a branch pipe 32 for recovering treatment liquid. The branch pipe 32 extends obliquely from a position higher than an upper end of the trap portion 26a. An upper end of the branch pipe 32 opens at a portion lower than the exhaust port 24b of the receiver 24. As will be described later, the treatment liquid condensed on the receiver 24 during the time of standby for the drying process is recovered to the treatment liquid reservoir 18 via the branch pipe 32.

A protection plate 34 made of, e.g. Teflon, having a great number of through-holes, is situated below the receiver 24 so as to cover the treatment liquid reservoir 18. The protection plate 34 has legs 34a attached to the bottom of the treatment bath 14. If a wafer Wi falls from the transfer arm 22, the protection plate 34 receives the wafer Wi and prevents it from striking against the bottom of the treatment bath 12.

A cooling spiral pipe 26 is situated in an upper part of the treatment bath 14 so as to extend along the side wall of the bath 14. A cooling medium such as cooling water is circulated through the cooling spiral pipe 36, thereby cooling and condensing (liquefying) vapor of treatment liquid rising from the vapor treatment unit 20. Thus, the vapor of the treatment liquid is prevented from escaping from the treatment bath 14.

A plate gutter 38 made of, e.g. quarts for receiving treatment liquid falling from the cooling spiral pipe 36 is provided below the cooling spiral pipe 36 along the side wall of the treatment bath 14. An outer peripheral portion of the plate gutter 38 is lightly attached to the side wall of the treatment bath 14. The gutter 38 is fixed to a support 40. The gutter 38 is inclined such that the level of the gutter surface rises from the outer peripheral portion towards an inner peripheral portion having a bent portion 38a. The plate gutter 38 varies in level in the circumferential direction of the treatment bath 14. A treatment liquid exhaust port 14a is formed in the side wall of the treatment bath 14 near the lowest portion of the gutter 38. The treatment liquid exhaust port 14a is connected to an inlet of a filter 44 outside the container 10 via an exhaust pipe 10 for recovering the treatment liquid. An outlet of the filter 44 is connected via an introducing pipe 46 for recovering the treatment liquid to a treatment liquid introducing port 14b formed at a side wall of the treatment bath 14. The treatment liquid introducing port 14b is formed at a level higher than the level of the treatment liquid 16 contained in the reservoir 18.

Figure 6:
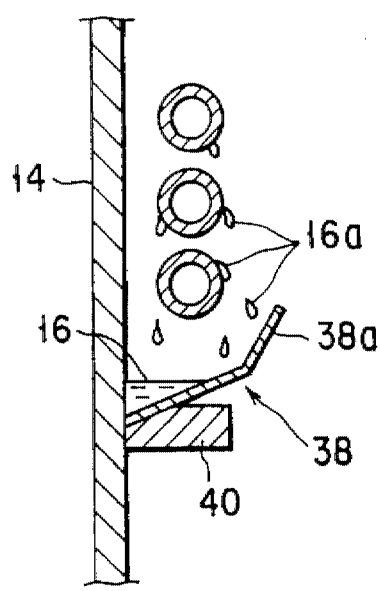
FIG. 6 illustrates the state in which a treatment liquid falling from a cooling spiral pipe in the substrate drying apparatus according to Example 1 is received by a bent portion of a plate gutter.

The operation of the substrate drying apparatus according to the present embodiment will now be described with reference to FIGS. 4 to 6. In FIGS. 4 and 5, the protection plate 34 is omitted. A lot of wafers W1 to W50, which have just been washed by, e.g. a pure water stray, are transferred by a transfer arm 22 and lowered to the vapor treatment section 14, as shown in FIG. 1. The arm 22 holds the wafers W1 to W50 at the position of the treatment section 20 during the drying process. Prior to the start of the drying process, the valve 30 is opened by a control unit (not shown). As has been described above, while power is being supplied to the drying process apparatus, i.e. the heating unit 12 is being operated, the inside of the treatment bath, in particular, the vapor treatment section 20, is saturated with vapor of the treatment liquid 16 rising from the reservoir 18. When the wafer Wi is situated in the vapor atmosphere, water adhering to the wafer surface is separated from the wafer surface by the vapor of treatment liquid and falls in the receiver 24 situated just below. As is shown in FIG. 4, the water in the receiver 24 flows from the exhaust port 24b at the bottom of the receiver 24 via the exhaust pipe 26 and the valve 30 to the drain tank. In addition, the treatment liquid, which has formed when the vapor of treatment liquid is condensed near the receiver 24 during the drying process, is mixed with the water and exhausted via the exhaust pipe 26.

After the drying process is completed, the wafers W1 to W50 are raised by the transfer arm 22 and taken out of the treatment bath 14. At this time, the vapor of the treatment liquid adhering to the wafer surface is dispersed and separated, and the wafer surface is dried. In order to facilitate the drying, a drying mechanism may be provided near the upper opening of the treatment bath 14. The drying mechanism blows air or inert gas such as $N_2$ gas to the wafer W.

Once the wafers W1 to W50 have been transferred out of the treatment bath 14, water does not fall from the vapor treatment section 20 to the receiver 24. However, for a while, wafer remaining in the receiver 24 is exhausted via the exhaust pipe 26. The valve 30 is closed by the control unit after a predetermined time period has passed from the completion of the drying process, i.e. when the water has been completely exhausted from the receiver 24 and the level of water in the exhaust pipe 26 has lowered at least below the branch pipe 32. Even if the level of water in the exhaust pipe 26 has lowered below the branch pipe 32 before the valve 30 is closed, the exhaust liquid is present on the upstream side of the trap portion 26a and therefore the outside atmosphere is cut off and does not rise into the treatment bath 14. In this way, the valve 30 is closed after a predetermined time period from the start of the drying process standby time. The liquid being present in the receiver 24 after the valve 30 is closed is a liquid which has formed when the vapor of treatment liquid 16 is cooled and condensed. This liquid is the treatment liquid 16 containing no water. As is shown in FIG. 5, the treatment liquid in the receiver 24, which has been fed from the exhaust port 24b to the exhaust pipe 26, immediately enters the branch pipe 32 and falls from the end opening of the branch pipe 32 in the form of drops 16b. Thus, the treatment liquid is recovered in the reservoir 18. The opening/closing timing of the valve 30 can be set in the following three choices: 1) the valve 30 is opened only during the drying process, 2) the specific resistance of treatment liquid is detected and the valve 30 is opened until the specific resistivity reaches a predetermined value, and 3) the valve 30 is opened if a liquid exhaust request signal is supplied or if the specific resistance value does not recover.

As has been described above, after a predetermined time period a remaining water removing time period) has passed from the start of the drying process standby time, the treatment liquid 16 condensed in the receiver 24 is recovered in the treatment liquid reservoir 18 within the treatment bath 14 via the exhaust pipe 16 and branch pipe 32. Since the ratio of the standby time occupying in the apparatus operation time to the process time is considerably large, a great amount of treatment liquid is saved per day or per month.

On the other hand, in the upper part of the treatment bath 14, both in the drying process time and in the standby time, the vapor of the treatment liquid 16 is cooled and liquefied by the cooling spiral pipe 36. As is shown in FIG. 6, drops of the treatment liquid condensed and adhering to the surface of each stage of the cooling spiral pipe 36 successively falls to a lower stage of the spiral pipe 36 while moving over the outer peripheral surface of the pipe 36. At the lowermost stage of the pipe 36, the size of the liquid drops 16a becomes maximum and falls from the spiral pipe 36. While falling, the drops 16a may disperse to the side of the pipe 36. In the present embodiment, the liquid drops 16a dispersed to the inside of the spiral pipe 36, i.e. to the center of the treatment bath, are captured by the bent portion 38a of the plate gutter 38 and there is no concern that the drops 16a may be dispersed onto the wafer W, receiver 24, etc.

The treatment liquid, which has fallen to the plate gutter 38 from the cooling spiral pipe 36, moves to the lower part of the gutter 38 in the circumferential direction of the treatment bath 14 and is supplied to the filter 44 via the exhaust port 14a and exhaust pipe 42. In the filter 44, impurities, dust, etc. is removed. The treatment liquid output from the filter 44 is fed to the introducing port 14b via the introducing pipe 46 and is let to fall in the reservoir 18 along the inner wall of the treatment bath 14. In this case, the introducing pipe 46 may be projected inside from the introducing port 14b, so that the treatment liquid falls directly from the outlet of the introducing pipe 46 into the reservoir 18.

In the substrate drying apparatus of the present embodiment, the treatment liquid 16 liquefied by the cooling spiral pipe 36 is exactly captured by the plate gutter 38 and the captured treatment liquid is recovered to the treatment liquid reservoir 18 after the impurities, dust, etc. are removed through the exhaust pipe 42, introducing pipe 46 and filter 44 for recovering the treatment liquid. Thus, the quality of the treatment liquid 16 is less degraded in the treatment bath 14. Accordingly, the number times of change of the treatment liquid 16 decreases, and the amount of consumed treatment liquid 16 decreases.

Figure 9:
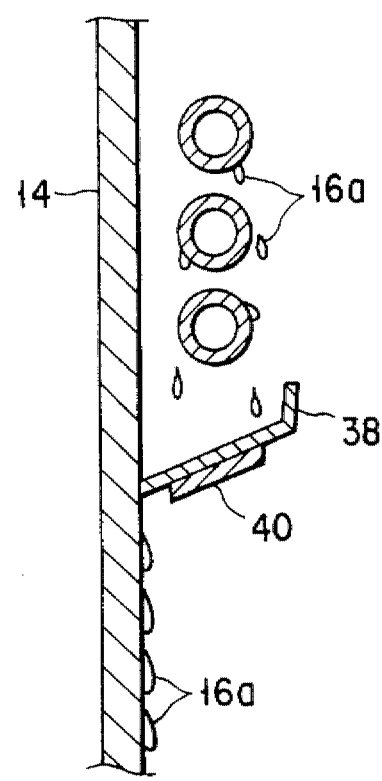
FIG. 9 illustrates the operation of the division-type plate gutter structure as shown in FIG. 8.
Figure 7:
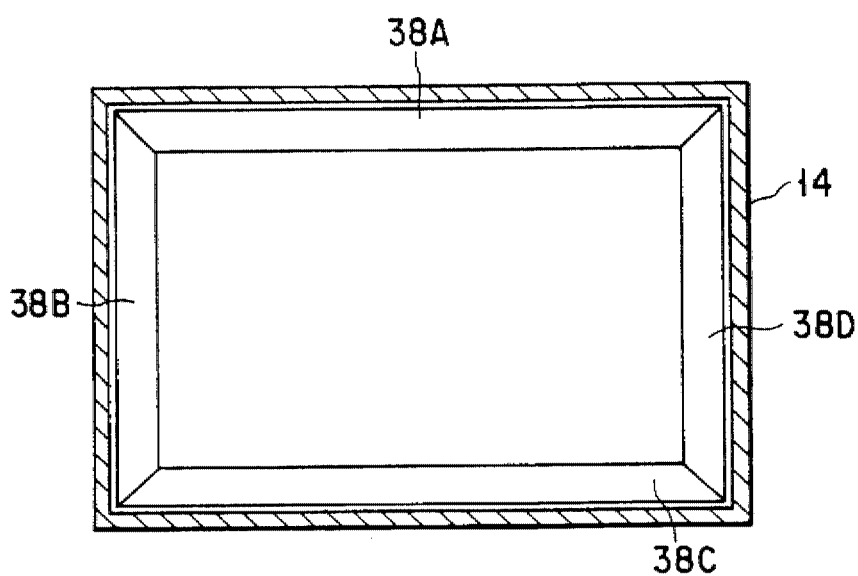
FIG. 7 is a plan view showing a division-type plate gutter structure in the substrate drying apparatus according to Example 1.

Because of precision of dimensions, it would often be difficult to exactly position the plate gutter 38 (or support member 40) of a frame shape to the inner wall of the treatment bath 14. However, if each of a plurality of divided gutter portions, e.g. each portion 38i of four gutter portions 38A, 38B, 38C and 38D, is attached to the inner wall of the treatment bath 14 independently, the plate gutter 38 can be situated exactly even if there is a variance in precision of dimensions. Moreover, as shown in FIGS. 8 and 9, it is possible to provide a gap between the plate gutter and the treatment bath so that treatment liquid may fall through the gap. In this example of structure, the frame-shaped gutter support member 40 is supported by gutter receiving seats 50 of quartz welded at several points, e.g. six points, at predetermined intervals on the inner wall of the treatment bath 14 so as to project from the inner wall of the treatment bath 14. Four-division plate gutters 38 (38A, 38B, 38C and 38D) are provided on the gutter support member 40 such that outer peripheral portions thereof are situated as close as possible to the inner wall of the treatment bath 14 (e.g. 0 to 0.5 mm). According to this structure, the treatment liquid, which has fallen from the spiral pipe 36 to the plate gutter 38, flows smoothly via a slight gap between the plate gutter 38 and the inner wall of the treatment bath 14 along the inner wall of the bath 14. The treatment liquid is neither dispersed nor adhered to the wafer W or receiver 24.

In the present embodiment, the valve 30 is provided in the exhaust pipe 26 on the downstream side of the trap portion 26a. The valve 30, however, may be provided on the upstream side of the trap portion 26a. Furthermore, the valve 30 may be provided within the treatment bath 14. The shape and dimensions of the branch pipe 32 are freely chosen. A plurality of branch pipes 32 may be provided, if necessary. The shape and structure of the receiver for receiving the treatment liquid separated from the objects are not limited to those of the receiver 24 in the present embodiment. The receiver may have various shapes and structures, e.g. a box shape or a hemispherical shape. Furthermore, the gutter means is not limited to the plate gutter 38 of the present embodiment and it may have various shapes and structures. For example, the gutter may have a curved cross section. The plate gutter 38 may be successively inclined to feed the treatment liquid to the exhaust port 14a more quickly and smoothly. Two or more of exhaust ports 14a, pipes 42 and pipes 46 for recovering the treatment liquid may be provided. If necessary, the pipes 42 and 46 for recovering the treatment liquid may be provided with pumps, and the filter 44 may be omitted. The structure of the cooling means is not limited to the spiral structure, and may be a panel structure, for example.

Figure 10:
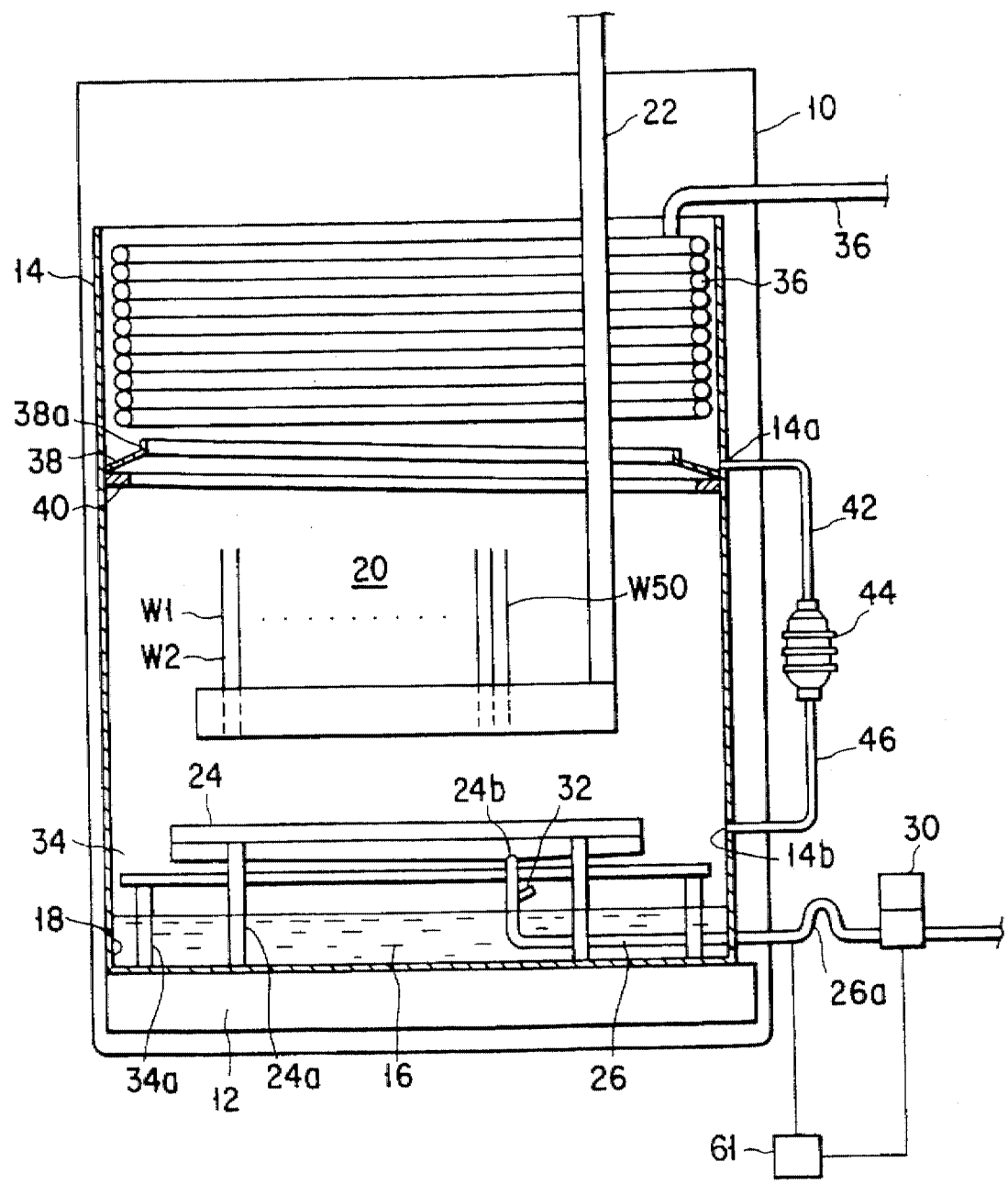

For example, as is shown in FIG. 10, the exhaust pipe 26 may be provided with a conductivity meter 61, so that the valve 30 may be opened and closed in accordance with a variation in sensed conductivity of the exhaust liquid. Besides, as shown in FIG. 11, the valve 30 may be opened and closed by a control unit 62 for controlling the driving means of the transfer arm 22. In this case, it is possible to provide the exhaust pipe 26 with the conductivity meter, as shown in FIG. 10, and to control the transfer arm 22 and valve 30 on the basis of the data obtained by the conductivity meter 61.

Figure 12:
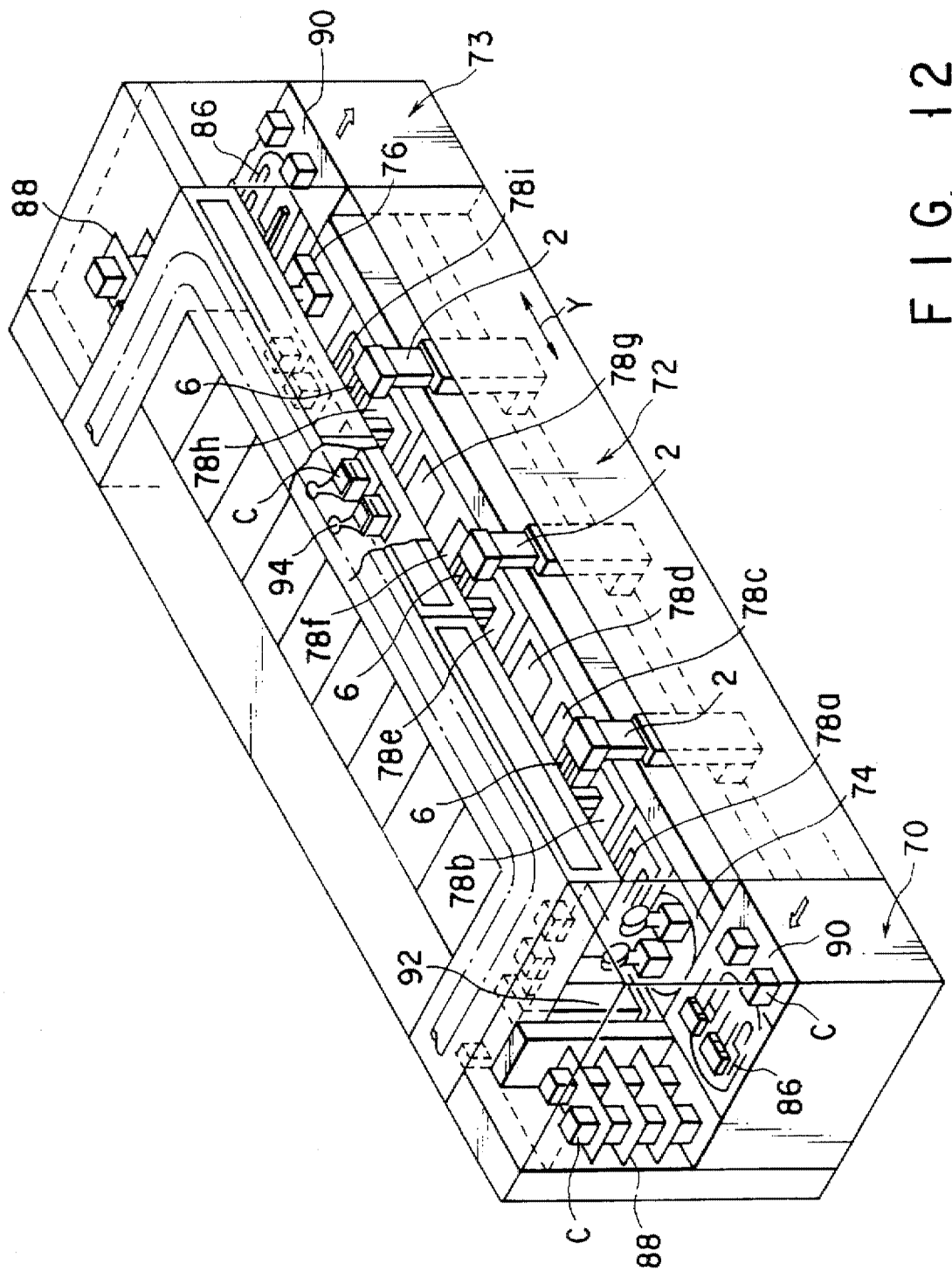
FIG. 12 shows an example of a wafer washing system in which the substrate drying apparatus of the present invention is used.

FIG. 12 is a perspective view showing an example of a wafer washing system using the substrate drying apparatus of the present embodiment. The washing system comprises an input buffer mechanism 70, a washing apparatus body 72 and an output buffer mechanism 73. A loader unit (wafer loading unit) 74 and an unloader unit (wafer unloading unit) 76 are provided at both ends of the washing apparatus body 72. A plurality of process units, e.g. 9 process units 78a to 78i, are provided linearly in a middle portion of the system. For example, the first process unit 78a is a transfer arm washing/drying unit, the second process unit 78b is a wafer chemical-washing unit, the third and fourth process units 78c and 78d are wafer water-washing units, the fifth process unit 78e is a wafer chemical-washing unit, the sixth and seventh process units 78f and 78g are wafer water-washing units, the eighth process unit 78h is a transfer arm washing/drying unit, and the ninth process unit 78i is a wafer drying unit. The substrate drying apparatus of the present embodiment is provided in the ninth process unit 78i (wafer drying unit).

A plurality of transfer robots 102, e.g. three transfer robots 102, each having a wafer chuck 106, are situated in front of the process units 78a to 78i so as to be movable vertically and in the Y-direction. The range of movement and transfer of each transfer robot 102 is limited in the Y-direction. Each transfer robot 102 can access to only the associated process unit 78. The input buffer mechanism 70 and output buffer mechanism 73 are provided with carrier transfer arms 86 for transferring wafer carriers C, carrier storage units 88 for temporarily storing the wafer carriers C, carrier mount tables 90 for transferring the wafer carriers C with the outside of the system, carrier elevators 92 for elevating the empty wafer carriers C, etc. The washing apparatus body 72 is provided with a carrier transfer mechanism 94 moving between a position above the loader unit 74 and a position above the unloader unit 76 via a path above transfer devices 82a to 82c.

In the input buffer mechanism 70, the empty wafer carriers C are put to the carrier transfer mechanism 94 by the carrier elevator 92 and transferred to the output buffer mechanism 73. While the wafer carriers C are being transferred, the carriers C are washed by a washing device such as shower device. After washed, the wafer carriers C are dried by a drying device such as a dry air blower. Accordingly, in the output buffer mechanism 73, washed wafers are contained in the washed and dried clean wafer carriers C.

In the present embodiment, wafers W ,are used as objects to be treated. However, the present embodiment is applicable to the case where other objects to be treated, such as LCD substrates and glass substrates, are dried.

Example 2

In the present embodiment, there is provided a substrate drying apparatus with a simple structure and a small size, which is capable of removing impurities in a treatment liquid at low cost. Specifically, in a substrate drying apparatus wherein a treatment liquid container for containing a treatment liquid is provided at a lower part of a treatment bath for containing objects to be treated and vapor produced by heating the treatment liquid in the treatment liquid container is put in contact with the objects to dry the objects, the treatment bath is provided with treatment liquid circulating means including impurity removing means and the treatment liquid in the treatment liquid container is circulated to remove impurities and dust from the treatment liquid.

The treatment liquid circulating means preferably comprises a liquid circulating pipe, extended from the outside of the treatment bath into the treatment liquid container, for circulating a treatment liquid, a circulation pump provided in the liquid circulating pipe, and a control unit for driving the circulation pump at a predetermined timing. With this structure, impurities in the treatment liquid can be removed periodically and exactly. It is desirable that the liquid circulation pipe be connected to a liquid replenishing pipe for replenishing the treatment liquid. With this structure, an independent liquid replenishing pipe is not required, and the apparatus can be further reduced in size. Furthermore, it is desirable that the liquid circulation pipe, circulation pump, impurity removing means and control unit be contained in a casing. With this construction, the part of the impurity removing mechanism is formed as a small unit separated from the substrate drying apparatus body, and the impurity removing mechanism can be easily applied to a conventional substrate drying apparatus with no modification.

Figure 13:
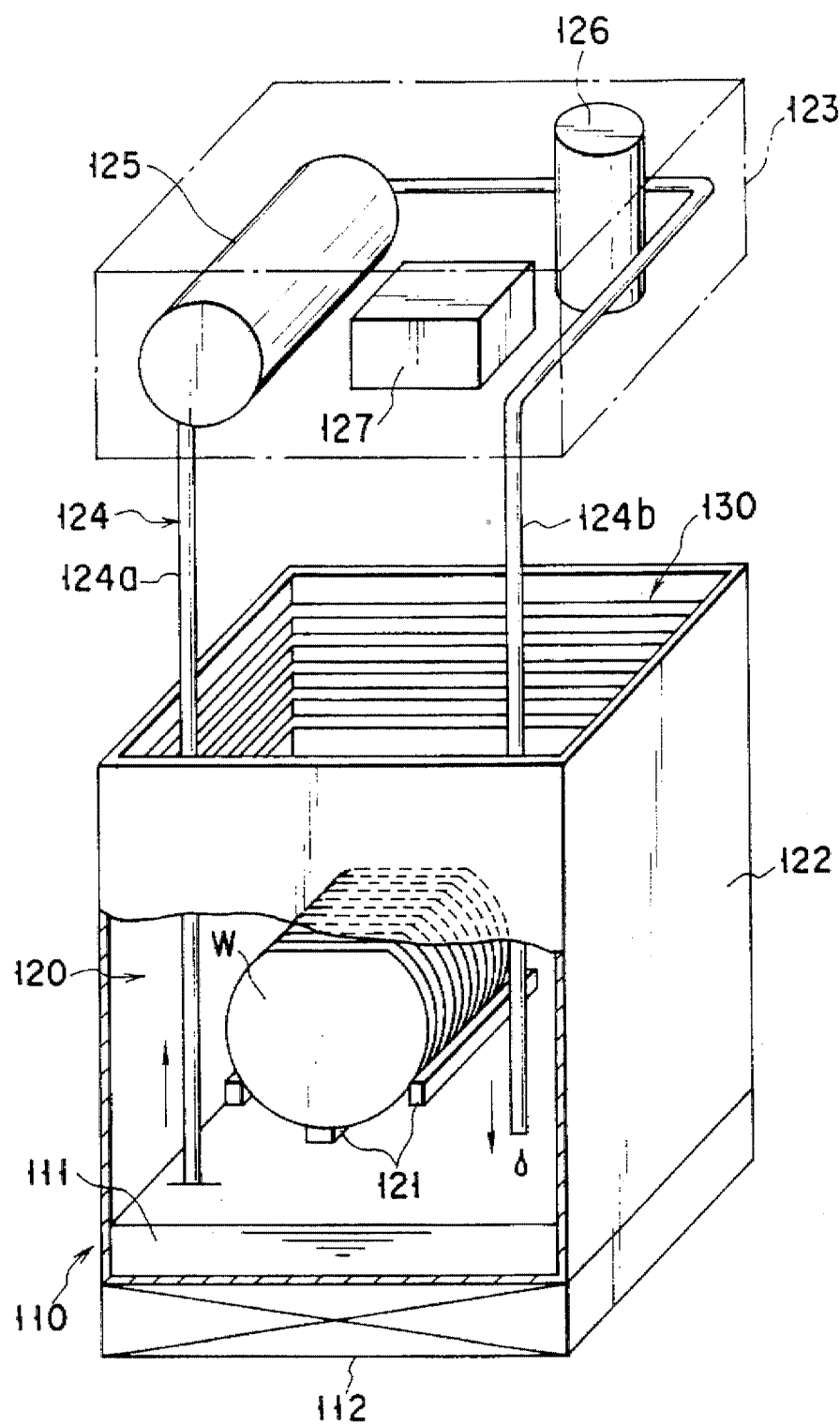

FIG. 13 is a perspective view showing an example of the substrate drying apparatus of the present embodiment. Reference numeral 122 denotes a box-shaped container with an open top end, which constitutes an apparatus body of the substrate drying apparatus. The container 122 houses a vapor generator 110 for generating vapor of a treatment liquid, e.g. IPA, a treatment bath 120 for putting vapor produced from the vapor generator 110 into contact with wafers W, and a cooling unit 130 for condensing vapor of IPA passing through the treatment bath 120. The vapor generator 110, treatment bath 120 and cooling unit 130 are arranged from the bottom to the top in this order. The vapor generator 110 comprises a treatment liquid reservoir 111, formed at an inside bottom portion of the container 122, for storing a predetermined amount of IPA, and a heater 112, provided at an outer bottom portion of the container 122, for heating the IPA up to a predetermined temperature, e.g. about 80° C., thereby to generate vapor.

In the treatment bath 120, a plurality of parallel holding rods 121 having holding grooves (not shown) at predetermined intervals are situated. For example, 50 wafers W are held by the holding rods 121 at predetermined intervals. The cooling unit 130 comprises a cooling spiral pipe arranged along the inner wall of the treatment bath 120 at an upper part of the bath 120. Heat exchange is performed between a cooling medium supplied through the cooling spiral pipe and vapor passing through the treatment bath, thereby condensing the vapor while filling the inside of the treatment bath 120 with IPA vapor.

On the other hand, a box-shaped casing 123 of an impurity removing mechanism for circulating the IPA in the reservoir 111 and removing impurities mixed in the IPA is situated above the container 122. Both end portions 124a and 124b of a liquid circulation pipe 124 for circulating the IPA are extended from the casing 123 downwards into the container 122. The liquid circulation pipe 124 is provided with a circulation pump 125 of, e.g. bellows type and a filter 126 having a filter element of, e.g. fluororesin, which functions as impurity removing means. The circulation pump 125, the filter 126 and a control unit 127 for driving the circulation pump 125 at a predetermined timing are housed in the casing 123. As regards the control timing, the control unit 127 may control the circulation pump 125, for example, at every predetermined time point, or at the time of raising the temperature of IPA (at a set temperature). Alternatively, a liquid level sensor is provided in the treatment liquid reservoir 111, and when the liquid level has lowered, the circulation pump 125 may be driven and at the same time IPA is replenished from a liquid replenishing pipe (not shown).

The operation of the present embodiment will now be described. For example, 50 wafers W are transferred by wafer transfer means (not shown) and held on the holding rods 121 in the treatment bath 120. Then, power is supplied to the heater 112 to heat and evaporate IPA in the treatment liquid reservoir 111. The evaporated IPA rises and flows among the wafers W, and the IPA comes into contact with the wafers W. The vapor put in contact with the surfaces of wafers W is condensed into drops. Water adhering to the surfaces of wafers W is mixed in the IPA drops and removed. The IPA drops containing water fall into the treatment liquid reservoir. This phenomenon is repeated until the temperature of the wafers W becomes substantially equal to the temperature of the vapor atmosphere. Thus, water and impurities such as particles adhering to the wafers W are removed, and the surfaces of wafers W are kept in a clean, dry state. The vapor passing through the treatment bath 120 exchanges heat with the coolant flowing through the cooling spiral pipe of the cooling unit 130 and thus condenses. Thereby, rising of vapor within the treatment bath 120 is decelerated, and a vapor atmosphere is created in the treatment bath 120. The condensed IPA liquid flows down along the inner wall of the container 122 and returns to the reservoir 111. On the other hand, the circulation pump 125 of the impurity removing mechanism is driven by the control unit 127 at a predetermined timing, and the IPA is circulated to the reservoir 111 via the circulation pipe 124. During the circulation, the IPA is filtered by the filter 126, impurities in the IPA are removed, and pure IPA is returned to the reservoir 111 from the end portion 124b.

As has been described above, according to the substrate drying apparatus of the present embodiment, the liquid circulation pipe 124 for circulating treatment liquid is provided in the treatment liquid reservoir 111, and the liquid circulation pipe 124 is provided with the filter 126 for filtering impurities mixed in the treatment liquid. Thus, with the simple construction, the impurities in the treatment liquid can be removed, the amount of particles in the IPA can be reduced, the size of the apparatus can be decreased, and the cost can be reduced. In particular, the liquid circulation pipe 124 for circulating the treatment liquid is provided with the circulation pump 125 and filter 126, and the pump 125, filter 126 and control unit 127 for controlling the pump 125 are housed in the casing 123. Thus, the part of the impurity removing mechanism is constructed as a small unit separated from the substrate drying apparatus body, and this small unit can be easily applied to the conventional substrate drying apparatus without modification.

FIG. 14 shows schematically another example of the substrate drying apparatus according to the present embodiment. Those parts of this substrate drying apparatus, which correspond to the parts of the apparatus as shown in FIG. 13, are denoted by like reference numerals, and a description thereof is omitted. In the apparatus as shown in FIG. 14, a casing 123 of an impurity removing mechanism is situated on the side of a container 122 or an apparatus body. Both end portions 124a and 124b of a liquid circulating pipe 124 extended from the casing 123 penetrate a side wall of the casing 122 and extend into a treatment liquid reservoir 111 within the container 122.

The end portion 124a of the circulating pipe 124 is connected via a valve 129 to a liquid replenishing pipe 123 for replenishing IPA. By driving a circulation pump 125 with the valve 129 being opened, IPA is replenished in the treatment liquid reservoir 111 via the end portion 124a. It is desirable that the end portion 124a be provided with a check valve for preventing the IPA sucked from the replenishing pipe 128 from being returned. The treatment liquid reservoir 111 within the container 122 is provided with a liquid level sensor 131. On the basis of a sensed signal from the sensor 131, a control unit 127 controls the circulation pump 125 and valve 129. Specifically, when the liquid level sensor 131 has sensed the state in which the level of IPA has lowered below a predetermined level, the control unit 127 opens the valve 129 and drives the circulation pump 125. When the sensor 131 has sensed the state in which the level of IPA has increased to a predetermined level, the control unit 127 closes the valve 129 and stops the circulation pump 125.

In the substrate drying apparatus having the above structure, the IPA condensed by on the surfaces of wafers W and cooling unit 130 is recovered in the treatment liquid reservoir 111, but part of the IPA vapor is exhausted from an upper open section via an exhaust system (not shown). Thus, the amount of IPA in the reservoir 111 decreases as the drying process progresses. If the liquid level sensor 131 has detected the state in which the level of IPA is below a predetermined level, the control unit 127 opens the valve 129 of the liquid replenishing pipe 128 and actuates the circulation pump 125. Thereby, the IPA in the reservoir 111 is circulated via the circulation pump 125 and filter 126 provided in the circulating pipe 124. The impurities in the IPA in the reservoir 111 are removed by the filter 126 and returned to the treatment liquid reservoir 111, and IPA is replenished from the replenishing pipe 128 to the reservoir 111 via the end portion 124b of the circulating pipe 124. When the sensor 131 has sensed that the liquid level of IPA in the reservoir 111 has reached a predetermined level by replenishment, the control unit 127 closes the valve 129 of the replenishing pipe 128 and stops the circulation pump 125.

According to the substrate drying apparatus as shown in FIG. 14, like the apparatus shown in FIG. 13, the impurities in the IPA in the reservoir 111 can be removed with simple construction, the size of the apparatus can be decreased and the cost can be reduced. In addition, IPA can be automatically replenished without requiring an independent liquid replenishing pipe, and the size of the apparatus can be further decreased.

FIG. 15 shows schematically another example of the substrate drying apparatus according to the present embodiment. Those parts of this substrate drying apparatus, which correspond to the parts of the apparatus as shown in FIG. 13, are denoted by like reference numerals, and a description thereof is omitted. In the apparatus as shown in FIG. 15, a gutter-like receiver 140 supported by support columns 141 erected from a treatment liquid reservoir ill is situated below holding rods 121. The receiver 140 can receive drops of IPA used for the drying process. A drain pipe 142 is connected to a bottom portion of the receiver 140 via a drain hole (not shown), and the condensed treatment liquid used for the process and put in the receiver 140 is exhausted to the outside. A condensed liquid capturing gutter 143 for recovering IPA, which has formed when vapor of IPA passing through the treatment bath 120, while not being used for the drying process, is condensed, is provided on the inner peripheral wall of the container 122 below the cooling unit 130. The IPA condensed liquid recovered by the capturing gutter 143 may be recovered to the reservoir 111 via a filter (not shown).

The condensed treatment liquid used for the drying process is recovered by the receiver 140 and exhausted to the outside, and the condensed IPA not used for the drying process is recovered by the capturing gutter 143 and reused. In addition, the circulation pump 125 of the impurity removing mechanism is controlled by the control unit 127 at a predetermined timing. The IPA is circulated to the reservoir 111 via the circulating pipe 124, and the impurities in the IPA in the reservoir 111 are removed. Thus, pure IPA can be returned to the reservoir 111 via the end portion 124b. Accordingly, the pure IPA can be used for the drying process at all times, and the drying process performance can be further enhanced.

The substrate drying apparatus of the present embodiment having the above structure can be used as an independent apparatus, but it can be incorporated in the washing system as shown in FIG. 12 for removing particles, organic contamination, metal impurities, etc. on the wafer surfaces.

In the present embodiment, wafers W are used as objects to be treated. However, the present embodiment can be applied to the case of drying other objects to be treated, such as LCD substrates, glass substrates, etc. The impurity removing means of the present embodiment may be constructed so as to remove water mixed in IPA, too.

Example 3

In a conventional washing system, a shielding member or the like is not provided to partition an upper part of a treatment bath and the space of movement of a transfer mechanism situated in front of the treatment bath. Thus, a single atmosphere is created within the apparatus. In order to prevent diffusion of particles, chemical mist, etc., it is necessary to increase the gas supply amount and the gas exhaust amount of a fan filter unit (FFU) for blowing a gas stream in the treatment bath. In addition, since the treatment bath is situated within the same atmosphere as the space for movement of the transfer mechanism, the gas stream is disturbed owing to the movement of the transfer mechanism and the down flow effect by the FFU lowers. Particles occurring in the movement space of the transfer mechanism may be introduced into the treatment bath.

According to the present embodiment, there is provided a washing system wherein the gas supply/exhaust amount necessary for down flow can be reduced, diffusion of chemical mist and particles can be prevented effectively, and introduction of particles into the treatment bath can be prevented. Specifically, in a washing system wherein treatment baths for washing objects to be treated are situated in a region defined by a side plate, a transfer mechanism for transferring the objects in the direction of arrangement of the treatment baths is situated in said region in front of the treatment baths, and blowing devices are provided for blowing gas streams towards at least the treatment baths, shield plates having notched recesses at upper end portions thereof are provided at upper parts of front end portions of the treatment baths, and partition plates are provided at upper parts of rear end portions of the treatment baths.

With this structure, gas streams blown from the blowing devices are shielded by the partition plates at least on the front and rear sides of the treatment baths, and therefore down flows are created towards the treatment baths without waste. Since the shield plates and partition plates are provided at the upper parts of the front and rear end portions of the treatment baths, mists in the treatment baths are prevented from diffusing from the front and rear parts of the treatment baths. Accordingly, the diffusion of the chemical atmosphere can be prevented with less amounts of gas supply/exhaust amounts than the prior art.

The transfer mechanism, situated in front of the treatment baths, for transferring the wafers is generally constructed such that holding devices such as wafer chucks are lowered into the treatment baths at predetermined positions in front of the treatment baths. Since the shield plates provided at the upper parts of the front end portions of the treatment baths have the notched recesses at the upper end portions thereof, as mentioned above, support members such as arms of the holding devices can move vertically in the recesses and the downward movement of the support members is not prevented.

It is desirable that gas streams be blown from above into the regions defined between the shield plates and front-side plates with this structure, the atmosphere of the region where the transfer mechanism is provided in front of the treatment baths is substantially separated from the atmosphere of the region of the treatment baths. Since the gas streams are blown from above into not only the treatment bath regions but also the transfer mechanism region, particles, etc. in the regions are brought to the lower parts of the regions. Accordingly, introduction of particles into the treatment bath region is prevented, and a clean atmosphere can be created. It is desirable that a gas exhaust mechanism for exhausting a gas from the region defined between the shield plate and front-side plates be provided separately. With this structure, particles occurring, e.g. in the above-mentioned regions can be exhausted separately, and the gas stream control in these regions can be effected separately from the treatment bath region. Thus, the apparatus can be driven with an optimal gas supply/gas exhaust balance being maintained in the entire washing system. Furthermore, it is desirable that drain pans be provided between adjacent ones of the upper portions of the treatment baths. With this structure, when the objects to be treated, such as wafers, are transferred by the transfer mechanism, drops of a chemical, etc. adhering to and falling from the objects can be received and can easily be drained to a predetermined exhaust system. Thus, contamination in the apparatus due to fallen drops of chemical, etc. can be prevented. Furthermore, the drain pans are provided among the upper end portions of the treatment baths. If there are gaps among the upper end portions, such gaps can be closed by the drain pans and the amount of exhausted gas can be reduced.

Figure 16:
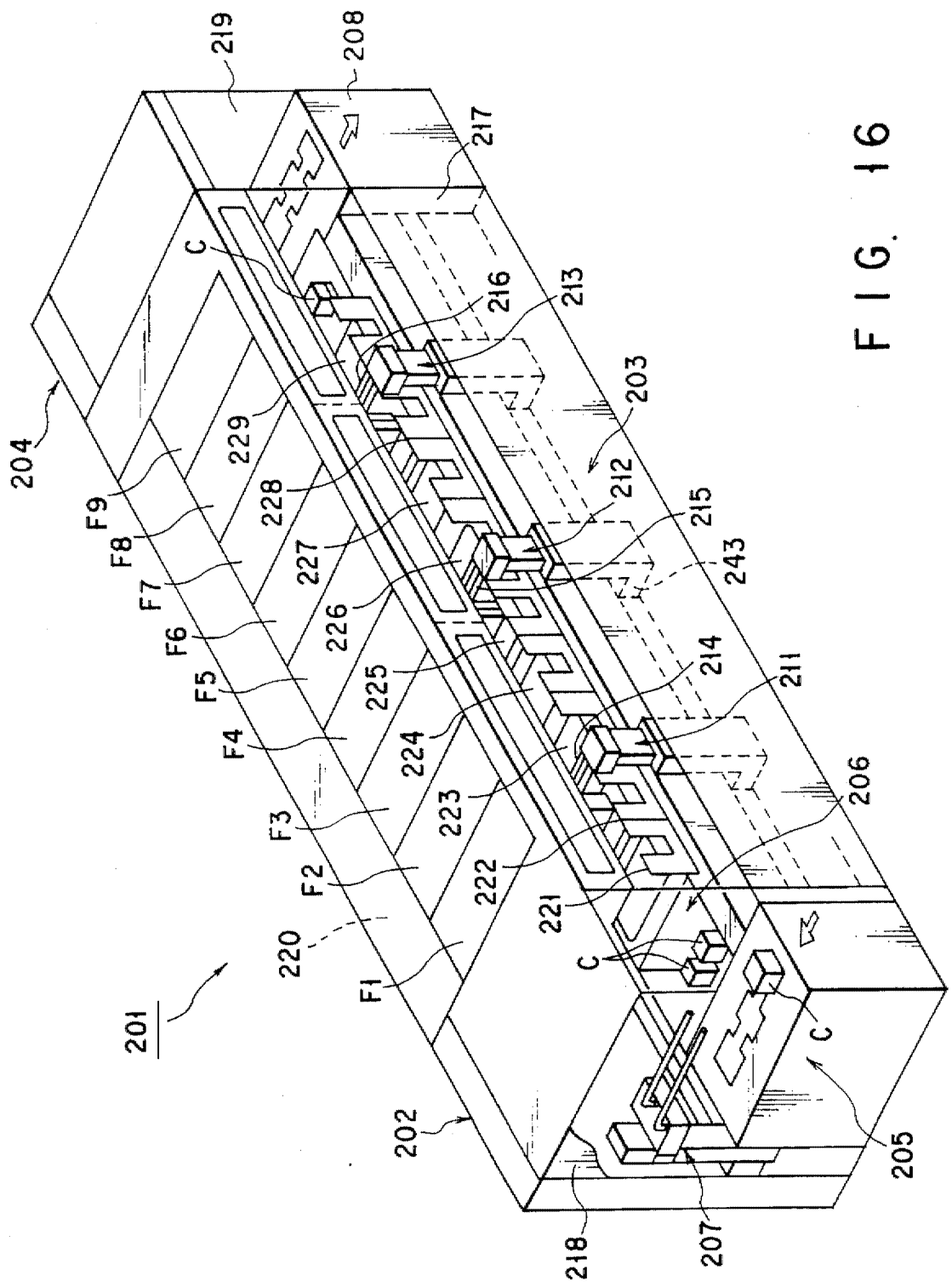

FIG. 16 is a perspective view of a washing system having the substrate drying apparatus according to the present invention. As is shown in FIG. 16, the washing system 201 is constituted by three zones of an input buffer mechanism 202 for inputting non-washed wafers in units of an amount placed in a carrier, a washing apparatus body 203 for washing the wafers, and an output buffer mechanism 204 for taking out the washed wafers in units of an amount placed in the carrier.

The input buffer mechanism 202 includes a mount unit 205 for transferring and mounting a carrier C storing a predetermined number of non-washed wafers, e.g. 25 wafers, and a transfer device 207 for transferring the mounted carrier C to a holding device 206. The washing apparatus body 203 is provided with three transfer robots 211, 212 and 213 on the front side thereof (the front side in FIG. 16). The transfer robots 211, 212 and 213 are provided with associated chucks 214, 215 and 216. The chuck 214 of the transfer robot 211 receives that amount of wafers, which corresponds to two carriers, i.e. 50 wafers, from the holding device 206 and holds the wafers. Then, these wafers are transferred to a washing process bath (described later). The output buffer mechanism 204 includes a mount unit 208 having substantially the same structure as the mount unit 205, a holding device (not shown) having the same structure as the holding device 206, and a transfer device (not shown) having the same structure as the transfer device 207.

The washing apparatus body 203 has a front plate 217. Side plates 218 and 219 are provided on the side of the mount unit 205 and on the side of the mount unit 208 of the entire washing system 201. A rear-face plate 220 is provided on the rear side of the washing system 201.

The washing apparatus body 203 includes, successively from the side of the mount unit 205, a chuck washing/drying process bath 221 for washing/drying the wafer chuck 214 of the transfer robot 211; a chemical washing process bath 222 for washing, with a chemical, impurities such as organic contamination, metal impurities and particles from the surfaces of the wafers; water washing process baths 223 and 224 for washing the wafers output from the chemical washing process bath 222 with, e.g. pure water; a chemical washing process bath 225 for washing the wafers with a chemical different from the chemical used in the chemical washing process bath 222; two water washing process baths 226 and 227 for washing the wafers output from the chemical washing process bath 225 with, e.g. pure water; a chuck washing/drying bath 228 for washing/drying the wafer chuck 216 of the transfer robot 213; and a drying process bath 229 for vapor-drying the wafers, from which the impurities have been removed, with use of, e.g. IPA (isopropyl alcohol). The chemical washing process baths 222 and 225 are constructed such that a washing process liquid in each bath overflows and circulates and impurities in the washing process liquid are removed during the circulation. The substrate drying apparatus as shown in Examples 1 and 2 is used in the drying process bath 229.

A ceiling portion of the washing system 201 is provided with fan filter units (FFU) F1 to F9 for blowing clean air, fed from a separate air conditioner, downwardly into the inside of the washing apparatus body 203 of the washing system 201. Specifically, these FFUs F1 to F9 are provided above the associated washing process baths. For example, as shown in FIG. 17, the FFU (F1 to F9) is situated above the chemical washing process bath 225 and transfer robot 212. The gas stream from the FFU (F5) is blown towards the chemical washing process bath 225 and transfer robot 212, as shown in FIG. 17.

Figure 19:
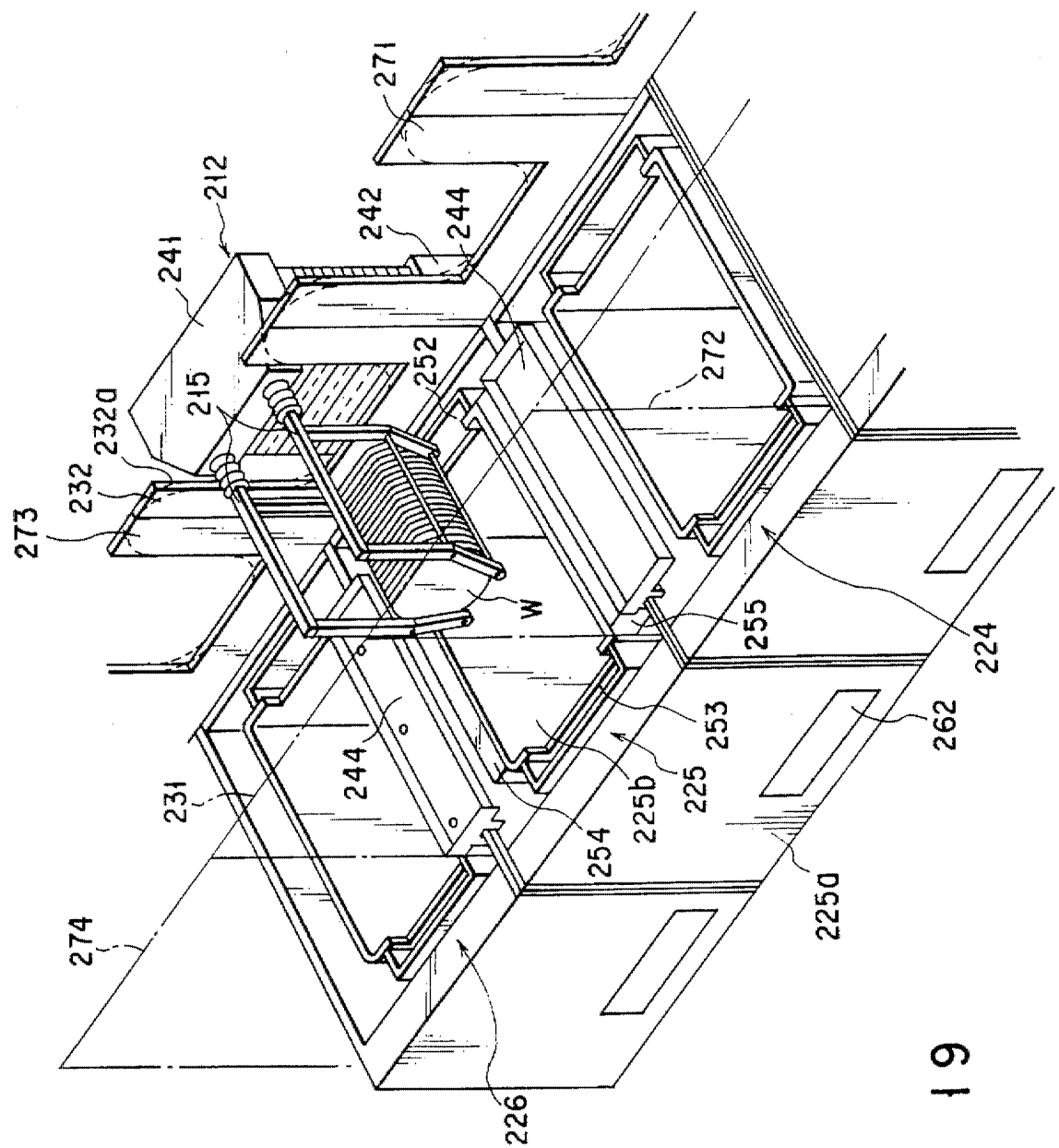
FIG. 19 is a perspective view showing drain pans in the washing system as shown in FIG. 16.

The structure surrounding the washing process baths will now be described with reference to, for example, the chemical washing process bath 225 flanked with the water washing process baths 224 and 226, as shown in FIG. 19. The chemical washing process bath 225 comprises an outer bath 225a and an inner bath 225b in which a chemical liquid is supplied and wafers W are immersed. A partition wall 231 is provided at a rear end portion of the outer bath 225a, and a shield plate (mist separator) 232 is provided at a front end portion of the outer bath 225a. As is shown in FIG. 17, the partition plate 231 is extended from the FFU (F5) situated at the ceiling portion of the system. The shield plate 232 is fixed to the outside of the outer bath 225a by means of, e.g. bolts. The partition plate 231 and shield plate 232 are made of material with high chemical-proof properties. A rear-side plate 233 is provided in rear of the partition plate 231 between the partition plate 231 and the rear-face plate 220. A space S for piping is defined between the rear-side plate 233 and the rear-face plate 220. The shield plate 232 is substantially U-shaped. A notched recess 232a is formed at a substantially central portion of the shield plate 232. The dimensions of the notched recess 232a are determined in accordance with vertical movement of the wafer chuck 215 of the transfer robot 212. The corner portions of the notched recess 232a may be curved, for example, as indicated by broken lines in FIG. 19. Thereby, the wafer chuck 215 of the transfer robot 212 can be moved efficiently.

As is shown in FIG. 19, the transfer robot 212 comprises the wafer chuck 215 constituted by a pair of horizontally arranged holding members (or arm members) capable of holding a batch of, e.g. 50 wafers W; a support member 241 for supporting the wafer chuck 215, a driving mechanism 242 for moving the support member 241 vertically (Z-direction) and back and forth (Y-direction), and a transfer base 243 (shown in FIGS. 16 and 17) for moving the driving mechanism 242 in the longitudinal direction (X-direction) of the washing apparatus body 203. The wafers W held by the wafer chuck 215 are supported on a holding member called "boat" within the inner bath 225b. The wafers W are washed with a chemical liquid supplied to the inner bath 225b. In this case, since the shield plate 232 has the notched recess 232a, the wafer chuck 215 moves down along the notched recess 232a.

As to the shape of the shield plate 232, the paired arm members of the wafer chuck 215 may be formed so as to be vertically movable independently. Specifically, two substantially U-shaped notched recesses, each being narrower than the notched recess 232a, may be provided such that, for example, a substantially W-shaped notch may be formed. In this case, the area of the notched recess can be reduced to a minimum, while separation of atmosphere and prevention of diffusion of mist can be enhanced.

Drain pans 244 are provided on upper edges of both side portions of the outer bath 225a. As is shown in FIG. 18, the drain pan 244 has an inclined bottom plate 245 to which side plates 246, 247, 248 and 249 are attached. A pair of engaging portions 250 are provided on the lower surface of the bottom plate 245. A suitable number of exhaust ports 251 are formed in a lower portion of the inclined bottom plate 245. The engaging portions 250 of the drain pan 244 are fixed to the upper edges of both side portions of the outer bath 225a such that each of the exhaust ports 251 is situated above an exhaust bath (not shown) of each of the adjacent water washing process baths 224 and 226. Accordingly, the liquid falling on each drain pan 244 is exhausted from the exhaust ports 251 formed at the lower part of the inclined bottom plate 245 via the exhaust bath of each of the water washing process baths 224 and 226. If the drain pan 244 is extended to a level above the chemical process bath 222, 225, the exhaust efficiency can be enhanced and dispersion of chemical mist can be prevented.

Small receiving baths 252 and 253 for receiving the chemical overflowing from the inner bath 225 are provided on the outside of the front and rear end portions of the inner bath 225b of the chemical washing process bath 225. Auto covers 254 and 255 are provided on the outside of right and left portions of the inner bath. 225b. Thus, during the chemical washing process, the upper face of the inner bath 225b is covered with the auto covers 254 and 255 and dispersion of chemical mist to the outside can be prevented. In addition, as shown in FIG. 17, a heater 256 for controlling the temperature of the chemical liquid supplied into the inner bath 225b is provided on the outer bottom surface of the inner bath 225b.

Figure 20:
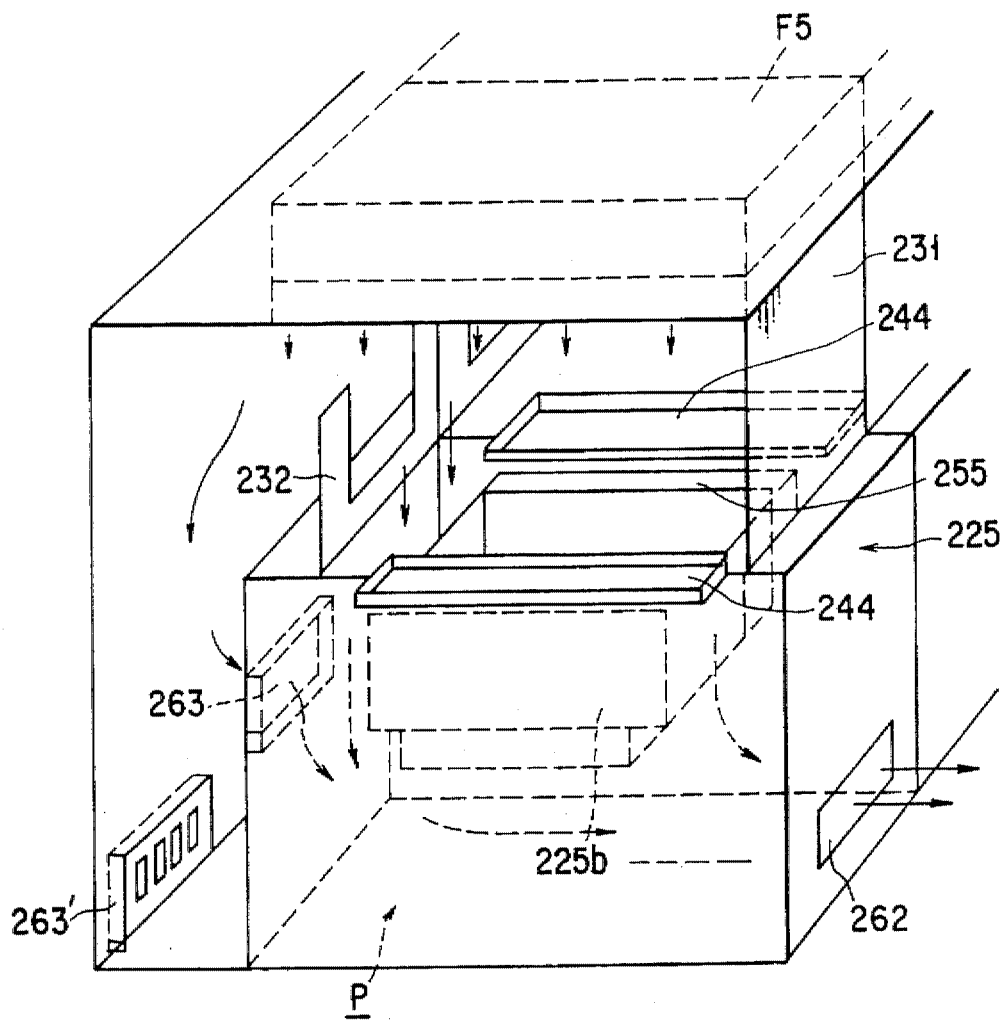
FIG. 20 illustrates the state of gas streams in the washing system as shown in FIG. 16.
Figure 21:
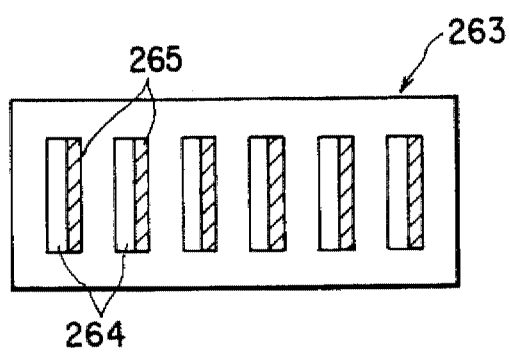
FIG. 21 is a plan view showing an exhaust plate in the washing system as shown in FIG. 16.

A space P is defined below the inner bath 225b, as shown in FIGS. 17 and 20. Piping for liquid for, e.g. supplying and recovering the chemical is arranged in the space P. The space P is defined so that gas can be exhausted by a central gas exhaust device (not shown) via a gas exhaust port 261 in a lower part of the outer bath 225a and a gas exhaust port 262 formed in a lower part of the rear-face plate 220. A gas exhaust plate 263, as shown in FIG. 21, is formed in an upper portion of the front surface of the outer bath 225a (on the transfer robot (212) side). The gas exhaust plate 263 has a plurality of exhaust ports 264. The exhaust ports 264 are provided with slidable shutters 265. By appropriately sliding the shutters 265, the degree of opening of each exhaust port 264 can be controlled in a range of 0% to 100%.

On the other hand, the water washing process baths 224 and 226 have basically the same structure as the chemical washing process bath 225. The structure of the water washing process bath 224 is identical to that of the water washing process bath 226. A shield plate 271 and a partition plate 272 having the same structures as the shield plate 232 and partition plate 231 are provided at front and rear ends of the water washing process bath 224, and also a shield plate 273 and a partition plate 274 are provided at front and rear ends of the water washing process bath 226. The shield plates 232, 271 and 273 are air-tightly connected to one another, and also the partition plates 231, 272 and 274 are air-lightly connected to one another. The same shield plates and partition plates as the shield plates 232, 271 and 273 and partition plates 231, 272 and 274 are provided at front and rear ends of the other process baths of the washing system 201. Thus, as is shown in FIG. 17, the inside atmosphere of the washing apparatus body 203 of the washing system 201 is divided by the series of the shield plates into a transfer robot driving area X located on the front side and a process area Y located on the rear side for containing the process baths.

The washing system 201 of the present embodiment is constructed, as described above. The operation of the washing system 201 will now be described. The carrier C storing 25 non-processed wafers W is brought to a predetermined position on the mount unit 205 by the transfer arm (not shown), as shown in FIG. 16. The carrier C is shifted to the rear side by the transfer mechanism (not shown) stored in the mount unit 205. If the next carrier C is placed on the aforementioned predetermined position, it is similarly shifted to the rear side. The two carriers C are arranged in the back-and-forth direction. From this state, the two carriers C are simultaneously held by the transfer device 207 and transferred to the holding unit (not shown) of the holding device 206, and only the wafers W (50 wafers) are held by the holding unit in an aligned manner. Thereafter, the wafers W are transferred successively to the respective washing treatment baths by the transfer robots 211, 212 and 213 and subjected to predetermined washing treatments.

The atmosphere in the vicinity of the chemical washing treatment bath 225 during the washing treatment will now be described. The shield plate 232 and partition plate 231 are provided on the front and rear sides of the inner bath 225b. Since clean air is blown downwardly from the FFU F5, a chemical mist occurring when the wafer chuck 215 moves vertically is efficiently exhausted from the exhaust port 262 via the gap between the outer bath 225a and inner bath 225b and the space P below the inner bath 225b. Thus, diffusion of the chemical mist into the apparatus can be prevented. At this time, the rear side of the inner bath 225b is completely shielded by the partition plate 231 and the front side thereof is substantially shielded by the shield plate 232. Thus, the chemical mist, as well as gas streams, can be efficiently exhausted. In other words, compared to the case where these partition plate 231 and shield plate 232 are not provided, the amount of supplied gas and exhausted gas used for exhausting the chemical mist can be reduced. Therefore, the FFU F5 can have a smaller size than a conventional device, with a lower power.

The atmosphere within the washing apparatus body 203 in which the process baths is divided by the shield plates into the drive area X and process area Y, as mentioned above. In addition, while a gas is supplied from the FFU F5 to each area, the gas within the drive area X is exhausted via the exhaust plate 263 and the gas within the process area Y is exhausted via the gap between the outer bath 225a and inner bath 225b. Accordingly, the amount of supplied/exhausted gas can be controlled for each area, and an optimal atmosphere in each area can be created. Thereby, the atmosphere in the washing system 201 can be controlled, and a smoothly flowing atmosphere can be created. In addition, diffusion of chemical mist and particles into the washing system 201 can effectively be prevented. In this case, the atmosphere can be controlled not only by controlling the mount of gas supplied to the FFU F5, but also by controlling the degree of opening of, e.g. the exhaust plate 263 by the shutters 265. Of course, finer control is achieved by providing the exhaust port 261 with an opening control valve, etc.

When the wafers W are held and transferred by the wafer chuck 215, for example, when the wafers W already subjected to the chemical washing process in the chemical washing process bath 225 are transferred, the chemical remains on the surfaces of wafers W. While the wafers W are being transferred to the water washing process bath 226, drops of the chemical may fall and adhere the surfaces of the outer baths 225a and 226a or may diffuse within the apparatus, resulting in contamination. However, since the drain pan 244 is provided between the chemical washing process bath 225 and water washing process bath 226, the fallen drops are received by the drain pan 244 and exhausted from the exhaust port 251 of the bottom plate 245 to the exhaust bath of the water washing process bath 226. Accordingly, such contamination can be prevented. Furthermore, the drain pan 244 covers substantially the gaps between the outer baths 225a and 226a and the inner baths 225b and 226b of the chemical washing process bath 225 and water washing process bath 226. As a result, the drain pan 244 contributes to the reduction of the amount of exhausted gas in this region. In other words, the gas is prevented from being exhausted via the gaps unnecessarily. Therefore, the amount of necessary supply gas can be reduced, in addition to the advantageous effects of the shield plates 232 and 273 and partition plates 231 and 274.

In the present embodiment, the inside atmosphere of the washing apparatus body 203 is divided into the drive area X and process area Y. It is possible, however, to provide a movement space for the wafer chuck 215 above the shield plate 232, as shown in FIG. 17, and to provide an upper shield plate 281 extending from the FFU F5, thereby more definitely separating the atmosphere of the drive area X from that of the process area Y. In addition, since the upper shield plate 281 can function as a flow rectifying plate for the FFU F5, better gas flow control in each area can be achieved, without causing interference of gas flows supplied to the drive area X and process area Y. In the present embodiment, the exhaust plate 263 for exhausting gas in the drive area X is provided at an upper part of the front surface of, e.g. the outer bath 225a of the chemical washing process bath 225. However, the exhaust plate 263 may be provided at a lower part of the front surface of the outer bath 225a, or it may be replaced with an exhaust plate 263' provided at a lower part of the front plate 217, as shown in FIG. 20.

In the present embodiment, wafers W are used as objects to be treated. However, the present embodiment can be applied to the case of washing other objects to be treated, such as LCD substrates, glass substrates, etc.

Example 4

In a conventional washing system, a wafer transfer mechanism transfers wafers W in one direction along the same line in an allocated range, so as to avoid adverse affect of washing process liquids in each step of a washing process. Thus, a load mechanism for taking out wafers W from a carrier and an unload mechanism for storing wafers W into a carrier must be provided at different locations. As a result, the structure of the apparatus is complicated, and the area occupied by an expensive clean room is increased, resulting in a higher installation cost. In addition to the wafer (W) transfer mechanism, it is necessary to provide a carrier transfer mechanism for transferring a carrier from the load mechanism to the unload mechanism. Thus, the structure of the washing system is more complicated, and the installation cost further increases. Moreover, when the wafers W are carried in and out, an automatic transfer vehicle (AGV) must be accessed at two locations on the load mechanism side and the unload mechanism side and accordingly the access by the AGV becomes complex.

The object of the present embodiment is to provide a washing system wherein a load mechanism and an unload mechanism of the mechanically same type are provided at one location, thereby dispensing with a carrier transfer mechanism, simplifying the structure of the system, reducing the size of the system, and remarkably decreasing the installation cost. Specifically, the washing system of this embodiment comprises a washing process mechanism having a plurality of washing process baths arranged linearly and a transfer mechanism for transferring objects to be treated along the washing process mechanism and transferring the objects between the washing process baths. The transfer mechanism includes a first transfer mechanism moving over the entire range of the washing process mechanism and a second transfer mechanism moving along the washing process mechanism on a movement path different from the movement path of the first transfer mechanism. The first transfer mechanism is principally used to transfer non-processed objects to the washing process baths and to transfer the objects between the washing process baths. The second transfer mechanism is used to restore the processed wafers to the original place.

According to this embodiment after the washing apparatus has received objects to be treated, the first transfer mechanism of the transfer mechanism receives the non-processed objects and transfers them to a predetermined washing process bath of the washing process mechanism. In the washing process bath, the objects are subjected to predetermined treatment and the processed objects are successively transferred by the first transfer mechanism to another washing process bath. While the objects are transferred between the washing process baths, the objects are subjected to predetermined treatments in the washing process baths. The second transfer mechanism restores the processed objects to the original place where the non-processed wafers were received. Thus, a series of washing steps is completed.

Figure 22:
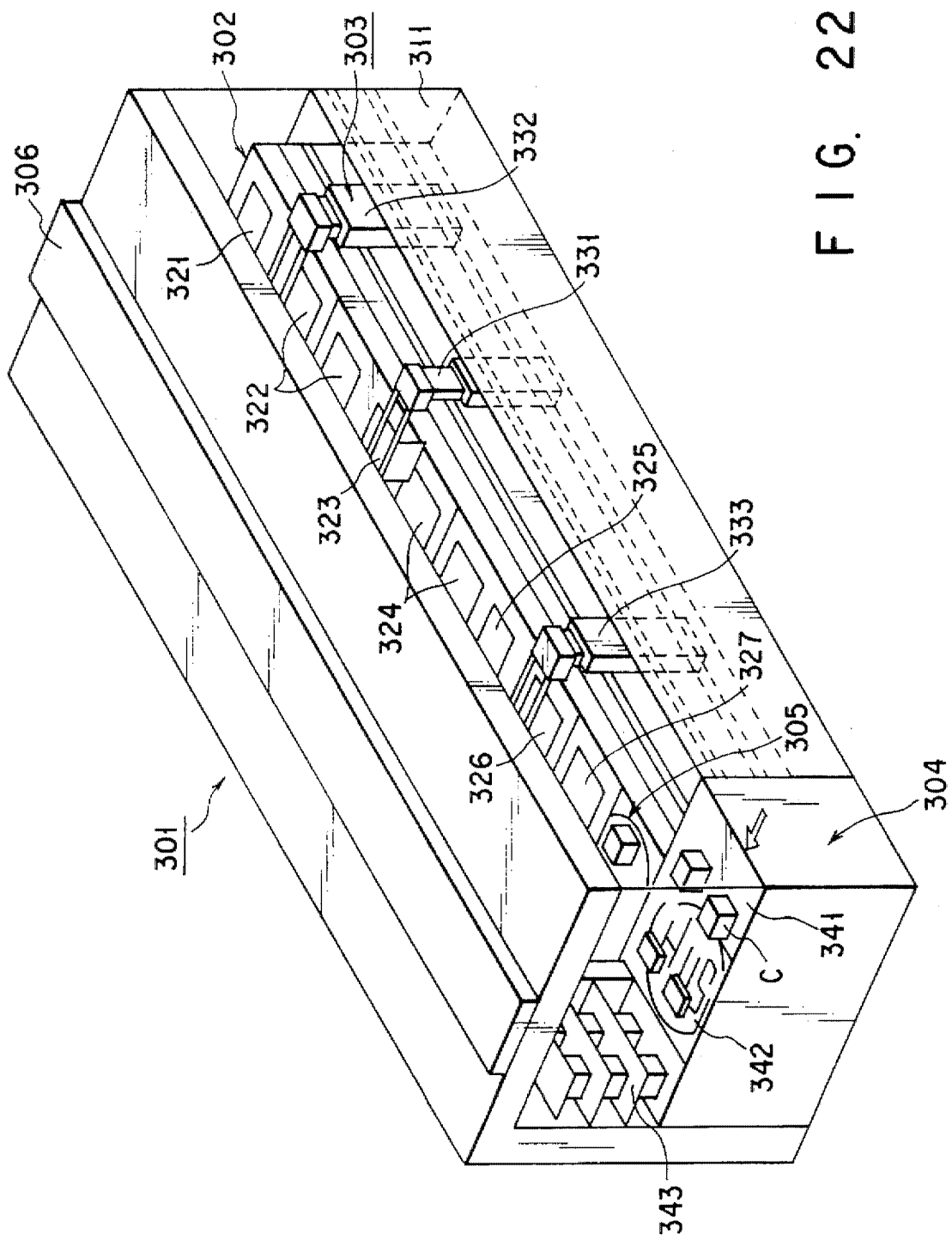
Figure 23:
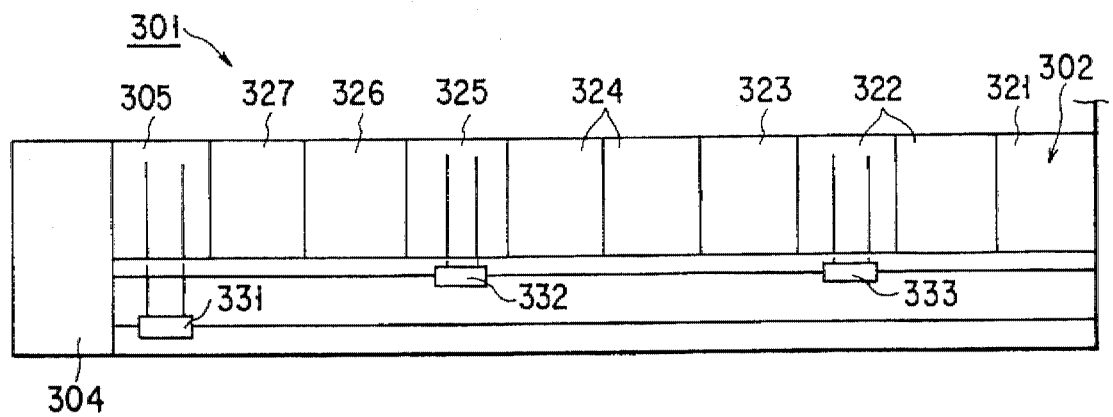
FIGS. 23 and 24 are plan views showing the relationship between a transfer mechanism and a washing mechanism in the washing system as shown in FIG. 22.

As is shown in FIGS. 22 and 23, a washing system 301 of the present embodiment comprises a washing apparatus body 302 having a plurality of washing process baths arranged in one direction, and a wafer transfer mechanism 303 for transferring objects such as wafers W along the washing apparatus body 302 and transferring the wafers W among the washing process baths. The wafer transfer mechanism 303 comprises a first transfer robot 331 (first transfer mechanism) reciprocally movable along a first running line, a second transfer robot 333 (second transfer mechanism) reciprocally movable along a second running line, and a third transfer robot 332 (third transfer mechanism). The first transfer robot 331 and the second and third transfer robots 333 and 332 are constructed to move on different lines along the washing apparatus body 302. A buffer mechanism 304 for temporarily storing a carrier C containing wafers W is provided on the left end (in FIG. 22) of the washing system 301. A load/unload mechanism 305 is provided between the buffer mechanism 304 and the washing apparatus body 302. The wafers W contained in two carriers C in units of 25 wafers are transferred by an elevation mechanism (not shown) of the load/unload mechanism 305. In FIG. 23, the running lines of the wafer transfer mechanism 303 are indicated by solid lines for the purpose of convenience.

As is shown in FIG. 22, the washing apparatus includes, successively from the right end (in FIG. 22) towards the load/unload mechanism 305, an alkali process bath 321 for washing out organic contamination, etc. on the wafer surface with an alkali treatment liquid such as ammonia treatment liquid; a water washing process bath 322 for washing the alkali-processed wafer with water; an acid process bath 323 for washing out impurities such as a metal with an acid treatment liquid such as hydrofluoric acid liquid; a water washing process bath 324 for washing the acid-treated wafer with water; a chuck washing/drying process bath 325 for washing/drying wafer chucks 331A, 332A, 333A; a drying process bath 326 for vapor-drying the impurity-free wafer with, e.g. IPA; and a chuck washing/drying process bath 327 for washing the wafer chucks 331A, 332A and 333A. The substrate drying apparatus, as disclosed in Examples 1 and 2, is used as the drying process bath.

Each of the alkali process bath 321, water washing process bath 322, acid process bath 323 and water washing process bath 324 contains an inner bath having, e.g. an open upper end. When treatment liquids overflow from the inner baths, the overflowing liquids are exhausted or circulated, thereby removing impurities in the liquids and circulating the clean liquids for reuse. Each of the inner baths is provided with a shutter (not shown). The shutters prevent the chemical (treatment liquid) atmosphere in the washing process baths from leaking to the outside. As is shown in FIG. 22, an FFU 306 is provided at a ceiling portion of the washing apparatus body 302. The FFU 306 has fans (not shown) associated with the washing process baths 321 to 327 of the washing apparatus body 302, and filters such as HEPA filters. The FFU 306 supplies down flows from the ceiling into the washing process baths 321 to 327 and exhausts chemical mists, etc., produced from the washing process baths 321 to 327, from the lower parts of these process baths.

Figure 26:
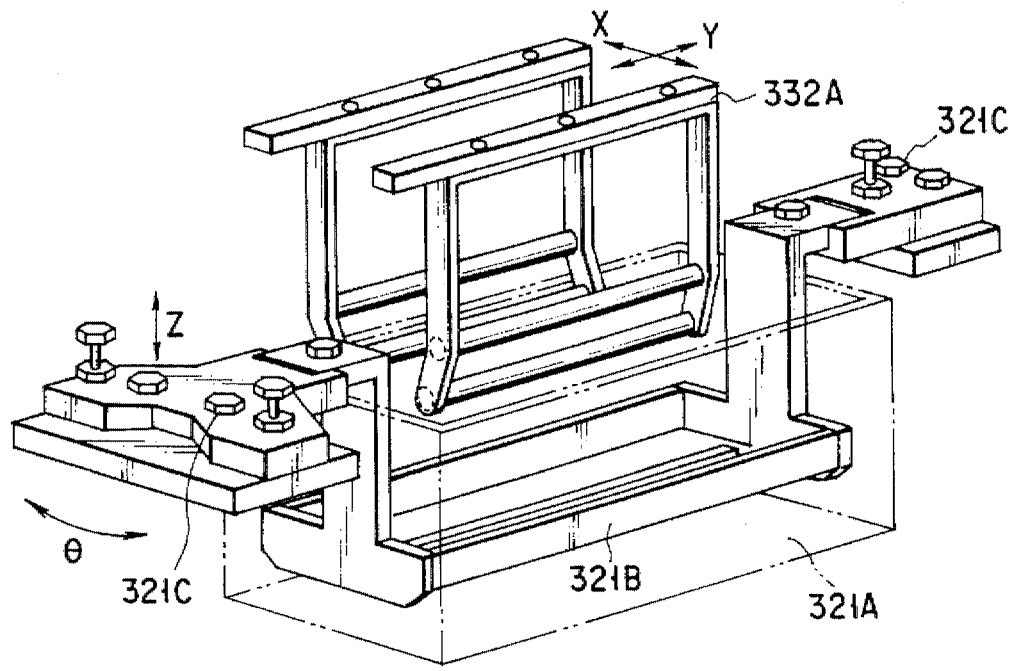
FIG. 26 is a perspective view showing the relationship between a wafer chuck of the washing system as shown in FIG. 22 and the washing apparatus body.

As is shown in FIG. 26, a wafer boat 321B is provided in the inner bath 321A of the alkali process bath 321, for example. The wafer boat 321B is formed of a material such as quartz having high anti-corrosion properties and high anti-dusting properties and designed to hold 50 wafers W. The wafer boat 321B has 50 grooves. The 50 wafers W are vertically supported in these grooves. The wafer boat 321B is supported on front and rear side walls of the inner bath 321A by bolts 321C. The position of the wafer boat 321B is adjusted by the bolts 321C in X-, Y-, Z- and θ-directions, so that the wafers W can be exactly transferred with the wafer chuck 332A of the second transfer robot 332, as shown in FIG. 26.

On the other hand, the first transfer robot 331 of the wafer transfer mechanism 303 and the second and third transfer robots 333 and 332 thereof are provided, respectively, on the first and second running lines provided between a front wall 311 of the washing system 301 and a front wall of the washing apparatus body 302. The first transfer robot 331 is moved along the first running line provided on the front wall (311) side of the washing system 301. The second and third transfer robots 333 and 332 move along the second running line provided on the washing apparatus body (302) side. These transfer robots are constructed so as not to interfere with each other during movement. The transfer robots 331, 332 and 333 have wafer chucks 331A, 332A and 333A, each being capable of holding, e.g. 50 wafers. The wafer chucks 331A, 332A and 333A are formed of a material such as quartz having high heat resistance and high anti-dusting properties. A wafer holding portion of each of the wafer chucks 331A, 332A and 333A has 50 grooves, in which 50 wafers W are supported as a batch.

Figure 24:
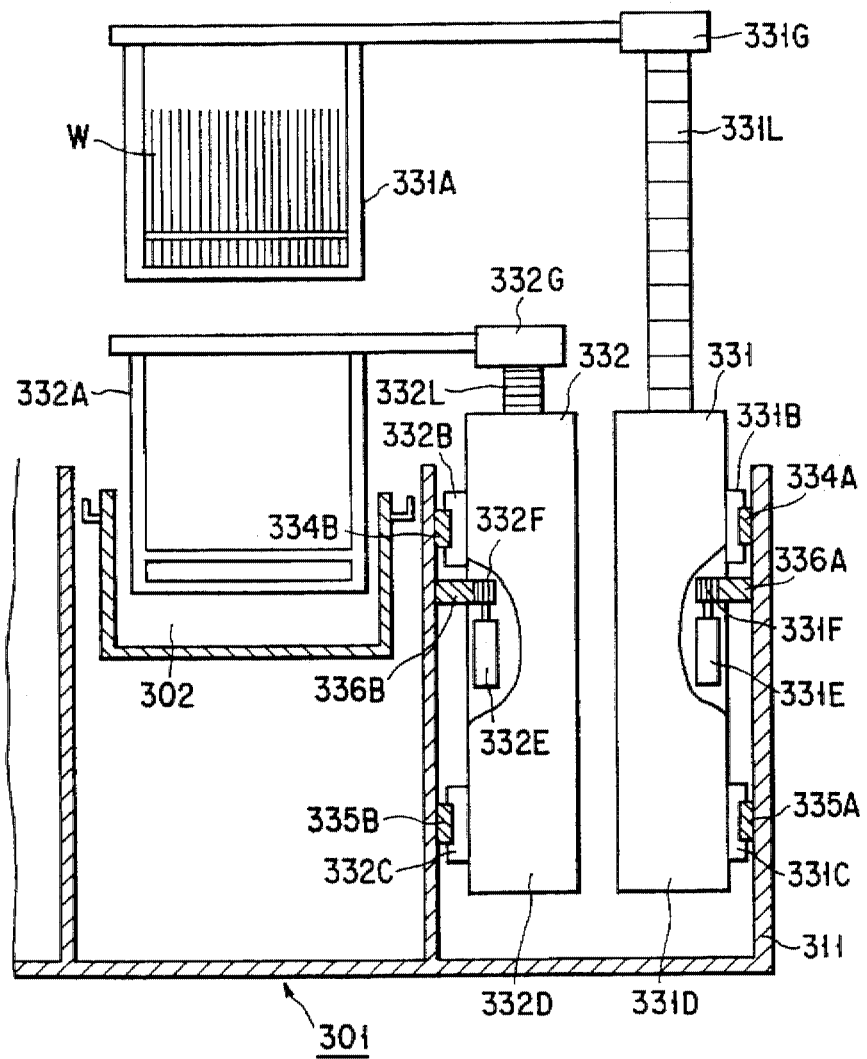

Specifically, as shown in FIG. 24, a guide rail 334A, a rack 336A and a guide rail 335A are provided on the inner surface of the front wall 311 of the washing system 301 so as to extend horizontally, such that the guide rails 334A, rack 336A and guide rail 335A are arranged vertically at predetermined intervals. The guide rails 334A and 335A are slidably engaged with sliding portions 331B and 331C of the associated first transfer robot 331. The rack 336A is engaged with a pinion 331F of a motor 331E provided within a housing 331D of the associated first transfer robot 331. When the motor 331E is driven, the first transfer robot 331 is moved along the guide rails 334A and 335A via the pinion 331F and rack 336A. It is desirable that the guide rails and rack be formed of PEEK, a synthetic resin such as fluororesin, etc. having high anti-wear properties and anti-dusting properties. The first transfer robot 331 transfers wafers W, while reciprocally moving among the regions of, in particular, the load/unload mechanism 305, alkali process bath 321 and the water washing process bath 322.

Guide rails 334B and 335B and rack 336B having the same structures as the guide rails 334A and 335A and rack 336A are provided on the outer surface of the front wall of the washing apparatus body 302, as shown in FIG. 24. The guide rails 334B and 335B are slidably engaged with sliding portions 332B and 332C of the associated second transfer robot 332. The rack 336B is engaged with a pinion 332F of a motor 332E provided in a housing 332D of the associated second transfer robot 332. When the motor 332E is driven, the second transfer robot 332 is moved in the region of the washing apparatus body 302 along the guide rails 334B and 335B via the pinion 332F and rack 336B. The third transfer robot 333 transfer the wafers W, while reciprocally moving in the region of the water washing process bath 324 among the regions of, in particular, the water washing process bath 322, acid process bath 323 and water washing process bath 324. Although not shown in FIG. 24, the second transfer robot 333 moves reciprocally, on the same running line as the third transfer robot 332, among the regions of, in particular, the chuck washing/drying process bath 325, drying process bath 326 and chuck washing/drying process bath 327, and transfers the washed/dried wafers W to the original place (load/unload mechanism 305).

Figure 25:
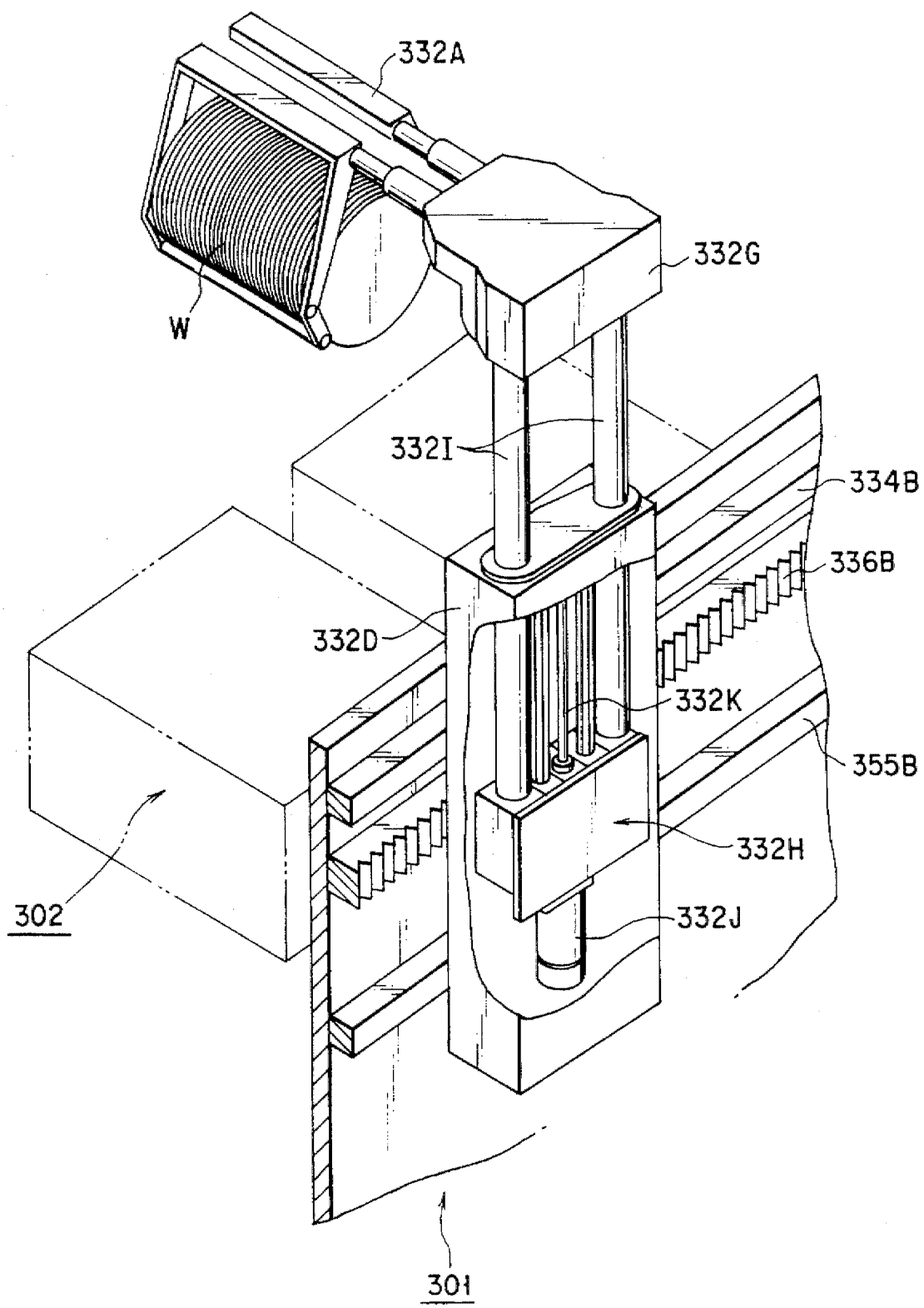
FIG. 25 is a perspective view showing a first wafer transfer mechanism as shown in FIG. 24.

The first, second and third transfer robots 331, 333 and 332 have the structure. For example, the structure of the third transfer robot 332 will now be described in detail with reference to FIGS. 24 and 25. A chuck base 332G is coupled to a proximal end portion of the wafer chuck 332A of the third transfer robot 332. The wafer chuck 332A is driven by a driving mechanism (not shown) housed in the chuck base 332G, thereby to hold or release 50 wafers W as a batch. The chuck base 332G is connected to an elevation mechanism 332H provided in the housing 332D via a pair of elevation rods 332I. The elevation mechanism 332H comprises mainly a motor 332J and a ball screw 332K connected to the motor 332J. The elevation rods 332I of the third transfer robot 332 shown in FIG. 25 are sealed from the outside with bellows seals 332L, as shown in FIG. 24.

The buffer mechanism 304 provided at the left end of the washing system 301 comprises, as shown in FIG. 22, a carrier mount table 341 for mounting a carrier C fed from the outside, and a carrier storage unit 343 for temporarily storing a carrier C, which is not to be processed immediately and which is transferred from the carrier mount table 341 by a carrier elevation mechanism 342. The load/unload mechanism 305 is provided between the buffer mechanism 304 and the washing apparatus body 302. By an elevation mechanism (not shown) of the load/unload mechanism 305, wafers W are input/output to/from two carriers C in units of 25. Specifically, when the wafers W are taken out of the carriers C by the load/unload mechanism 305, the wafers W stored in units of 25 in the linearly arranged carriers C are simultaneously raised by the elevation mechanism, and adjacent wafers W are brought to each other so as to become one body. Thereafter, the 50 wafers are simultaneously held by the wafer chuck 331A by the first transfer robot 331, as described above. On the other hand, when the load/unload mechanism 305 receives the washed wafers W from the third transfer robot 333, the load/unload mechanism 305 performs the operations of taking out the wafers W in a reverse manner. The load/unload mechanism 305 is provided with an aligning mechanism (not shown) for aligning orientation flats of the wafers W, for example, at an upper position or a lower position.

The operation of the washing system 301 according to the present embodiment will now be described. At first, wafers W stored in the carriers C in units of 25 are transferred by the automatic transfer vehicle (AGV) onto the carrier mount table 341 of the buffer mechanism 304 of the washing system shown in FIG. 22. The carrier elevation mechanism 342 is actuated to transfer the carriers c in units of two to the load/unload mechanism 305. Carriers C brought in thereafter are transferred to the carrier storage unit 343 by the carrier transfer mechanism 342 to temporarily store the wafers W of these carriers C.

Once the load/unload mechanism 305 has received two carriers C, the load/unload mechanism 305 is actuated to align the 50 wafers W in the two carriers C, with their orientation flats being aligned, and raises the wafers W up to a predetermined position. On the other hand, the first transfer robot 331 is actuated to move the wafer chuck 331A into the chuck washing/drying chamber 327. The washed and dried wafer chuck 331A receives the 50 wafers W situated in the load/unload mechanism 305. As is shown in FIGS. 24 and 25, the elevation mechanism is driven to raise the wafer chuck 331A via the elevation rods up to such a level that the wafer chuck 331A does not interfere with the wafer chucks 333A and 332A of the second and third transfer robots 333 and 332 positioned below the first transfer robot 331. At the same time, the pinion 331F is driven by the motor 331E, thereby moving the first transfer robot 331 to the rightmost alkali process bath 321 via the rack 336A and guide rails 334A and 335A. At the position of the alkali process bath 321, the wafers W are transferred to the wafer boat 321B (see FIG. 25) and subjected to alkali washing treatment.

When the alkali washing treatment for the wafers W is completed, the wafer chuck 331A of the first transfer robot 331 receives the wafers W from the alkali treatment bath 321 as a batch through the operational procedures reverse to the above, and shifts the wafers W to the wafer washing process bath 322 and washes the wafers W with water by the same operations as described above. After the water washing, the nearest second transfer robot 332 is actuated to receive the wafers W from the water washing process bath 322 and transfers the wafers W to the acid process bath 323. The wafers W are put in the wafer boat of the acid process bath 323 and subjected to acid treatment with hydrofluoric acid. Then, the wafers W are transferred from the acid process bath 323 to the water washing process bath 324 by the second transfer robot 332 and are subjected to water washing treatment. During this time, the wafer chuck 331A of the first transfer robot 331 is washed and dried in the chuck washing/drying process bath 327, and the first transfer robot 331 is returned to the load/unload mechanism 305 in order to transfer the next batch of wafers W. The wafer chucks 333A and 332A of the second and third transfer robots 333 and 332 are washed and dried in the chuck washing/drying chamber 325, where necessary, and the second and third transfer robots 333 and 332 initiates the next operations.

After the wafers W are subjected to water washing treatment in the water washing process bath 324, the second transfer robot 333 receives the wafers W from the water washing process bath 324 and subjects the wafers W to IPA vapor drying treatment in the drying process bath 326. Thereafter, the wafers W are transferred to the load/unload mechanism 305. The load/unload mechanism 305 stores the dried wafers W in two carriers C. The carriers C containing the washed/dried wafers W are transferred from the load/unload mechanism 305 to the buffer mechanism 304 by the carrier elevation mechanism 342. Then, the wafers W are transferred from the buffer mechanism 304 by the AGV in units of a carrier for the subsequent process.

In the present embodiment, the first transfer robot 331 331 transfers the non-processed wafers W from the load/unload mechanism 305 to the remotest alkali process bath 321 and water washing process bath 322 for alkali treatment. The third transfer robot 332 moves on a running line different from the running line of the first transfer robot 331, thereby transferring the alkali-treated wafers W from the water washing process bath 322 to the acid process bath 323 and water washing process bath 324 for acid treatment. The second transfer robot 333 moves on the same running line as the third transfer robot 332, thereby transferring the acid-treated wafers W from the water washing process bath 324 to the drying process bath 326 for drying treatment and also transferring the wafers W to the original place (load/unload mechanism 305).

According to the present embodiment, the first transfer robot 331 can move over the entire distance of the washing apparatus, and the second and third transfer robots 333 and 332 can move on the running line different from that of the first transfer robot 331 along the washing apparatus body 302. Thus, conventionally separated load mechanism and unload mechanism can be integrated into a single load/unload mechanism 305. That is, the unload mechanism can be dispensed with. Accordingly, the carrier transfer mechanism, which has been required in the prior art, can be omitted. Thus, the entire apparatus can be simplified, and the installation cost for the washing system 301 can be reduced. Moreover, since the load mechanism and the unload mechanism are integrated into the load/unload mechanism, the installation space for the expensive clean room can be saved and the installation cost can be further reduced. Furthermore, the AGV can be accessed at only one location, and the driving control and moving range thereof can be simplified. In the present embodiment, even if any one of the second and third transfer robots 333 and 332 malfunctions, the outside first transfer robot 331 can move over the entire distance of the washing apparatus body 302. Thus, the first transfer robot 331 can support the functions of either of the malfunctioning second and third transfer robots 333 and 332.

In the washing system 301 of the present embodiment, it is possible that the wafers W are transferred with use of transfer jigs, while the wafers W are not directly held by the wafer chucks 331A, 332A and 333A, and the transfer jigs are substituted for the wafer boats for the washing process. The wafer transfer mechanism 303 and transfer jig used in the washing system 301 of the present embodiment will now be described with reference to FIG. 28. As is shown in FIG. 28, a transfer jig 307 for transferring wafers W is formed of a material such as quartz having high heat resistance and high anti-dusting properties, as a wafer support member for supporting 25 wafers W vertically within the carrier C. The transfer jig 307 is detachably attached to the carrier C. Twenty-five wafer support grooves 307A having shapes matching with peripheral portions of the wafers W are formed in parallel to one another in a bottom surface of the transfer jig 307. The wafers W are supported in the wafer support grooves 307A. Upper end portions of the transfer jig 307, extending in the longitudinal direction of the jig 307, are provided with a pair of flange portions 307B. A pair of arcuated grooves 307C are formed in a bottom surface of each flange portion 307B at a predetermined distance between the grooves 307C in the longitudinal direction. The flange portions 307B extend in a direction perpendicular to the direction of extension of the flange portion 307B. A wafer chuck 303A of a wafer transfer mechanism 303 (described later) holds the transfer jig 307 at the arcuated grooves 307C. An opening 307D is formed in a center portion in the width direction of the bottom portion of the transfer jig 307. The opening 307D extends over the entire length in the longitudinal direction of the jig 307. Washing treatment liquid flows upwards through the opening 307D.

On the other hand, the wafer chuck 303A of the wafer transfer mechanism 303 is constructed so as to be able to hold two linearly arranged transfer jigs 307 at a time. Specifically, inwardly extending round-rod engaging portions 303B are formed in units of four at lower end portions of the wafer chuck 303A. The engaging portions 303B are engaged with the arcuated grooves 307C provided on both sides of the linearly arranged transfer jigs 307. Accordingly, when the transfer jig 307 is held by the wafer chuck 303A, the engaging portions 303B of the wafer chuck 303A are swung in the direction of double-headed arrows shown in FIG. 28, thereby holding the two transfer jigs 307 at the arcuated grooves 307C. Of course, when the transfer jigs 307 are held, the jigs 307 may be raised from the inside of the carrier C by the load/unload mechanism 305.

With this structure, the wafers W can be transferred along with the transfer jigs 307 by the first to third transfer robots 331, 333 and 332. The wafers W along with the transfer jigs 307 can be immersed in the washing process baths of the washing apparatus body 302 for the respective washing treatments. Thus, the wafer boat of each washing process bath can be dispensed with. Therefore, unlike the prior art, positional adjustment of wafer boats is not required, and the operability of the washing system 301 can be enhanced.

Figure 27:
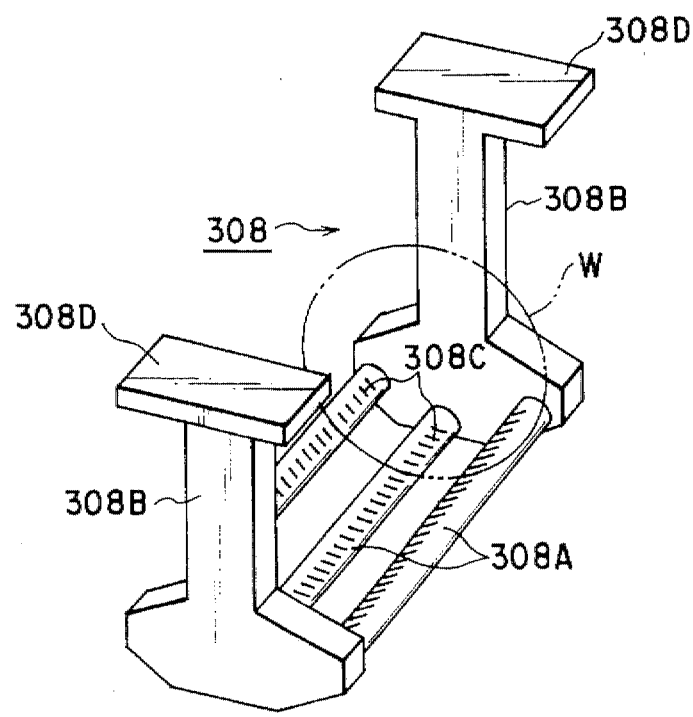
FIG. 27 is a perspective view showing the relationship among a wafer chuck, a carrier and a transfer jig in a washing system according to Example 4.

In addition, in the present embodiment, the transfer jig 307 may be replaced with a transfer jig 308, as shown in FIG. 27. As is shown in FIG. 27, the transfer jig 308 comprises three support rods 308A for supporting wafers W at their lower peripheral edges at regular intervals, and a pair of support plates 308B coupled at both ends of the three support rods 308A. For example, 50 grooves 308C, in which the peripheral edges of the wafers W are engaged, are formed in the three support rods 308A, and 50 wafers W are vertically supported in the grooves 308C. Flange portions 308D are formed at upper end portions of the support plates 308B. The flange portions 308A are held on both sides by the wafer chuck 303A of wafer transfer mechanism 303. The flange portions 308D are used when the transfer jig 308 is suspended at upper end portions of the inner bath of the washing process bath in the washing process. According to the present embodiment, the same advantages as the above embodiments can be obtained, except that there is a need to transfer the wafers from the carrier C to the transfer jig 308.

In this embodiment, the wafer transfer mechanism 303 is moved by using auxiliary mechanisms such as guide rails 334A, 334B, 335A and 335B and racks 336A and 336B. Such auxiliary mechanisms are not limited to those shown in the embodiment. Besides, the wafer chuck driving mechanism of the wafer transfer mechanism 303 is not limited to that shown in the embodiment and may be modified on an as-needed basis. Specifically, it should suffice if the transfer mechanism 303 comprises a first transfer mechanism movable over the entire distance of the washing apparatus body and a second transfer mechanism movable on a running line different from that of the first transfer mechanism, and objects to be treated can be input/output at one place. In the present embodiment, wafers W are used as objects to be treated. However, the present embodiment can be applied to the case of washing LCD substrates. In the present invention, Examples 1 to 4 may be combined, if necessary.

As has been described above, according to the substrate drying apparatus of the present invention, a treatment liquid which falls, when the vapor of the treatment liquid is condensed, in a receiver for receiving water removed from objects with use of vapor of the treatment liquid, can be efficiently recovered in a treatment liquid reservoir in a process bath, without no waste, during the drying process standby time. Thus, the amount of consumed treatment liquid can be reduced. Moreover, according to the substrate drying apparatus of the present invention, dust, etc. mixed in the treatment liquid can be removed, thereby preventing degradation of the treatment liquid and reducing the amount of consumed treatment liquid.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An apparatus for drying a target substrate, comprising:
a process bath having a first region for containing said substrate, and a second region for containing a volatile treatment liquid;
heating means for evaporating said treatment liquid to form evaporated treatment liquid;
cooling means arranged above said first region, for condensing evaporated treatment liquid to form condensed treatment liquid;
a receiver arranged between said first and second regions, for receiving a mixture of water and condensed treatment liquid when said substrate is being dried in said first region, said water having been removed from said substrate by evaporated treatment liquid while said condensed treatment liquid having been generated by condensation of evaporated treatment liquid;
an exhaust pipe connected to said receiver, for exhausting said mixture from said receiver to an outside of said process bath;
a valve arranged on said exhaust pipe, for opening and closing said exhaust pipe;
a branch pipe connected to said exhaust pipe at a location between said receiver and said valve, and having a discharge port located in said process bath and above said treatment liquid, for returning condensed treatment liquid from said receiver to said second region, in a state where said valve is closed when no target substrate is being dried in said first region.

2. The apparatus according to claim 1, wherein said branch pipe is connected to a portion of said exhaust pipe which extends downward from said receiver.

3. The apparatus according to claim 1, wherein said exhaust pipe has a trap portion between said receiver and said valve, for preventing outside gas from coming into said process bath.

4. The apparatus according to claim 3, wherein said discharge port of said branch pipe is located higher than a top of said trap portion.

5. The apparatus according to claim 1, further comprising a conductivity meter connected to said exhaust pipe, for measuring conductivity of a liquid flowing in said exhaust pipe.

6. The apparatus according to claim 5, further comprising control means, connected to said conductivity meter and said valve, for controlling opening/closing of said valve on the basis of data from said conductivity meter.

7. The apparatus according to claim 6, wherein said control means is capable of controlling transfer means for transferring said substrate into said first region.

8. The apparatus according to claim 1, wherein said cooling means comprises a spiral pipe arranged along an inner wall of said process bath and a coolant flowing in said spiral pipe.

9. The apparatus according to claim 1, further comprising a collecting means arranged below said cooling means, for receiving and collecting droplets of said treatment liquid which have been condensed by said cooling means.

10. The apparatus according to claim 9, wherein said collecting means comprises a gutter member arranged along an inner wall of said process bath.

11. The apparatus according to claim 10, further comprising a recovery pipe connected to said gutter member, for returning part of said treatment liquid which has been collected in said gutter member to said region.

12. The apparatus according to claim 11, wherein said recovery pipe is provided with filter means.

13. The apparatus according to claim 9, wherein said collecting means comprises a gutter member arranged along and separated from an inner wall of said process bath.

14. The apparatus according to claim 12, wherein said gutter member is formed by combining a plurality of plate members.

15. The apparatus according to claim 1, further comprising a shield plate having a notched recess for permitting elevation of transfer means for transferring said substrate into said first region, said shield plate being attached to a surface of said process bath which faces said transfer means, and a partition plate attached to a surface of said process bath which is opposite to said surface to which said shield plate is attached.

* * * * *